United States Patent
Yamabe et al.

(10) Patent No.: US 12,185,539 B2
(45) Date of Patent: Dec. 31, 2024

(54) METHOD FOR MANUFACTURING A SEMICONDUCTOR STORAGE DEVICE INCLUDING A DIVISION FILM

(71) Applicant: Kioxia Corporation, Tokyo (JP)

(72) Inventors: Kazuharu Yamabe, Yokkaichi Mie (JP); Yoshiro Shimojo, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 455 days.

(21) Appl. No.: 17/412,933

(22) Filed: Aug. 26, 2021

(65) Prior Publication Data
US 2022/0285391 A1 Sep. 8, 2022

(30) Foreign Application Priority Data
Mar. 8, 2021 (JP) .................................. 2021-036506

(51) Int. Cl.
*H10B 43/27* (2023.01)

(52) U.S. Cl.
CPC ................... *H10B 43/27* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35;
(Continued)

(56) References Cited

U.S. PATENT DOCUMENTS 9,368,509 B2 * 6/2016 Pang ...................... H10B 41/27
10,381,229 B2 8/2019 Yada et al.
(Continued)

FOREIGN PATENT DOCUMENTS

JP 2020-205387 A 12/2020

*Primary Examiner* — Didarul A Mazumder
*Assistant Examiner* — Gustavo G Ramallo
(74) *Attorney, Agent, or Firm* — Foley & Lardner LLP

(57) ABSTRACT

In a method for manufacturing a memory, a first stacked body is formed by stacking a first insulating film and a first sacrificial film. A first columnar body including a first semiconductor portion extending in the first stacked body in the first direction and a charge trapping film provided on an outer peripheral surface of the first semiconductor portion is formed. A second columnar body provided in a second direction of the first columnar body and including a second semiconductor portion stretching in the first stacked body in the first direction and a charge trapping film on an outer peripheral surface of the second semiconductor portion is formed. A second insulating film is formed above the first stacked body. A third columnar body including a third semiconductor portion provided on both the first columnar body and the second columnar body and stretching in the second insulating film in the first direction and a first gate insulating film provided on an outer peripheral surface of the third semiconductor portion is formed. A first division insulating film extending in the first direction and a third direction intersecting the first direction and the second direction and dividing the third semiconductor portion of the third columnar body in the second direction is formed.

12 Claims, 38 Drawing Sheets

(58) Field of Classification Search
CPC ........ H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 10,566,348 B1 | 2/2020 | Yeh et al. | |
| 2009/0230462 A1* | 9/2009 | Tanaka | H10B 43/27 257/326 |
| 2019/0067025 A1 | 2/2019 | Yada et al. | |
| 2020/0251489 A1* | 8/2020 | Tsutsumi | H10B 41/35 |
| 2020/0295030 A1* | 9/2020 | Kim | H01L 21/823418 |
| 2020/0402999 A1 | 12/2020 | Nakaki | |
| 2021/0327805 A1* | 10/2021 | Lee | H10B 41/35 |

* cited by examiner

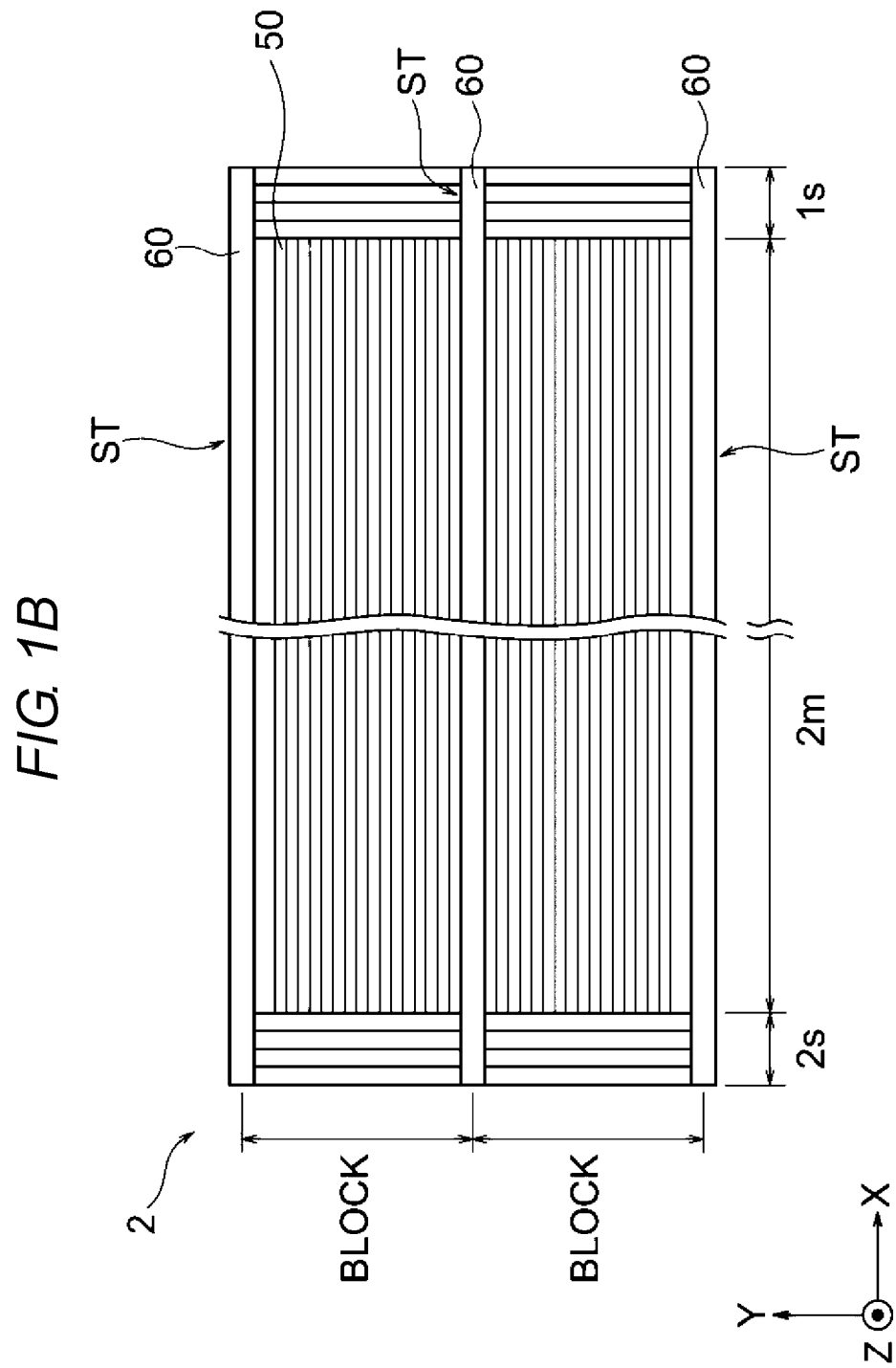

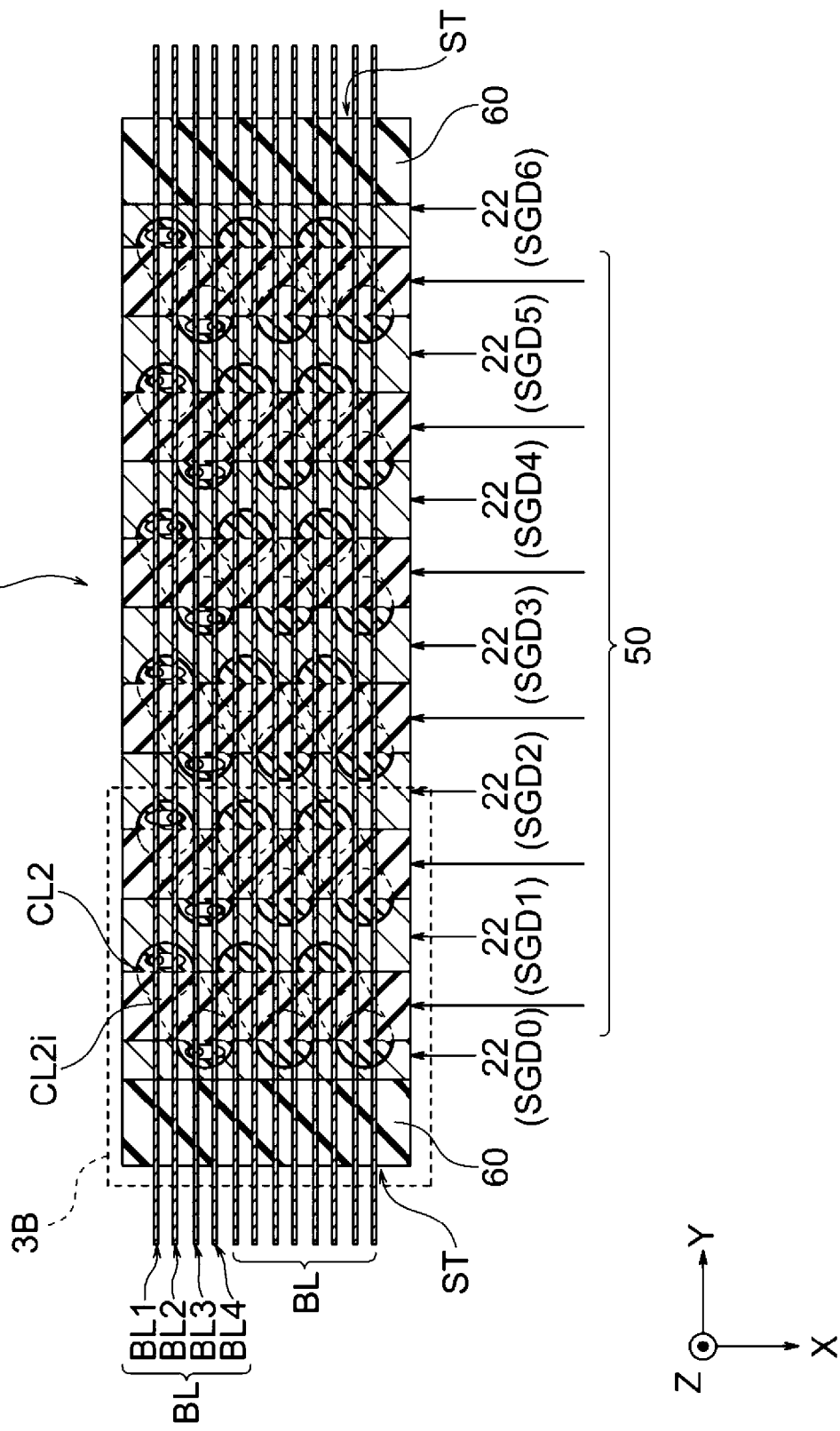

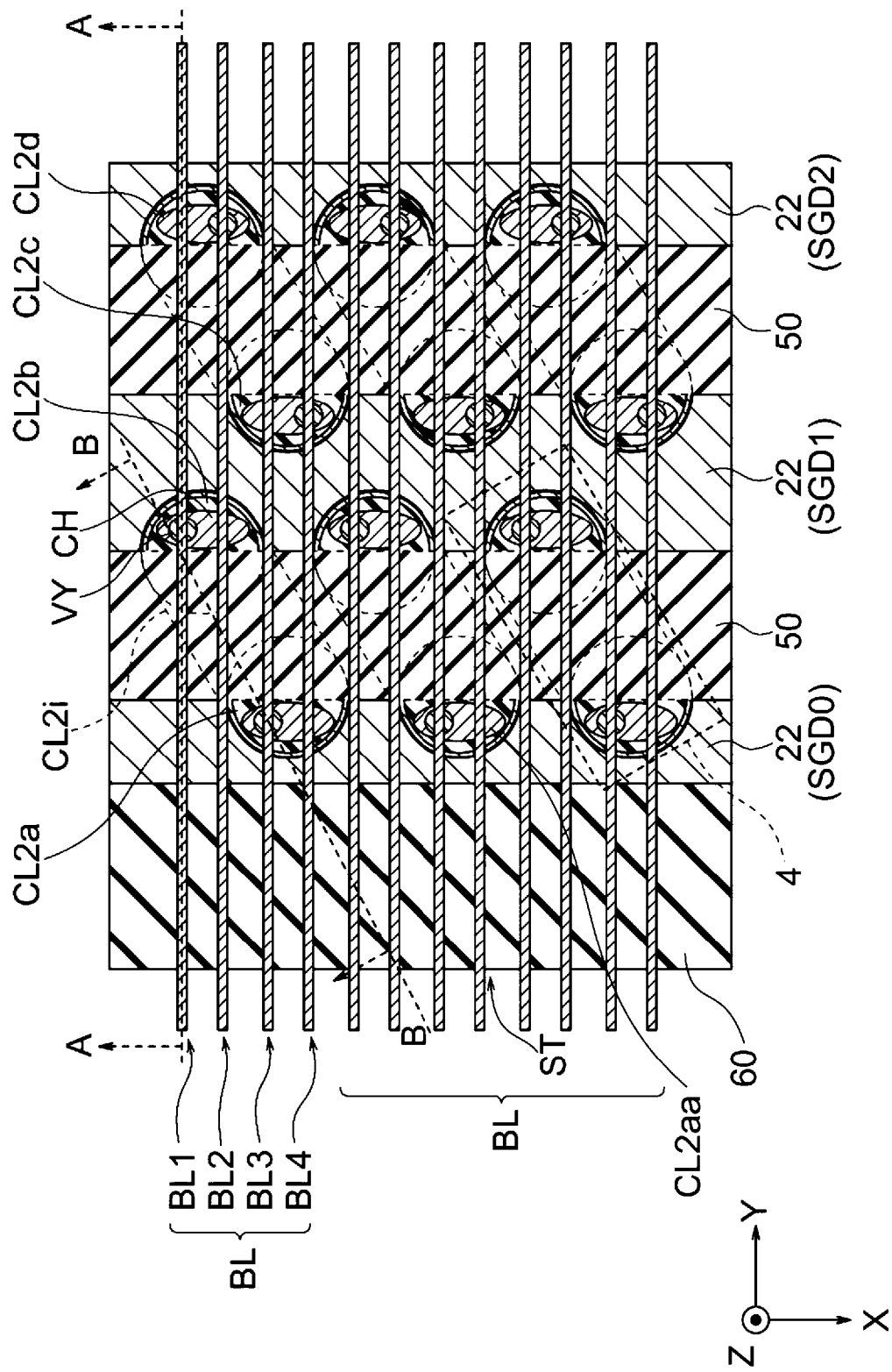

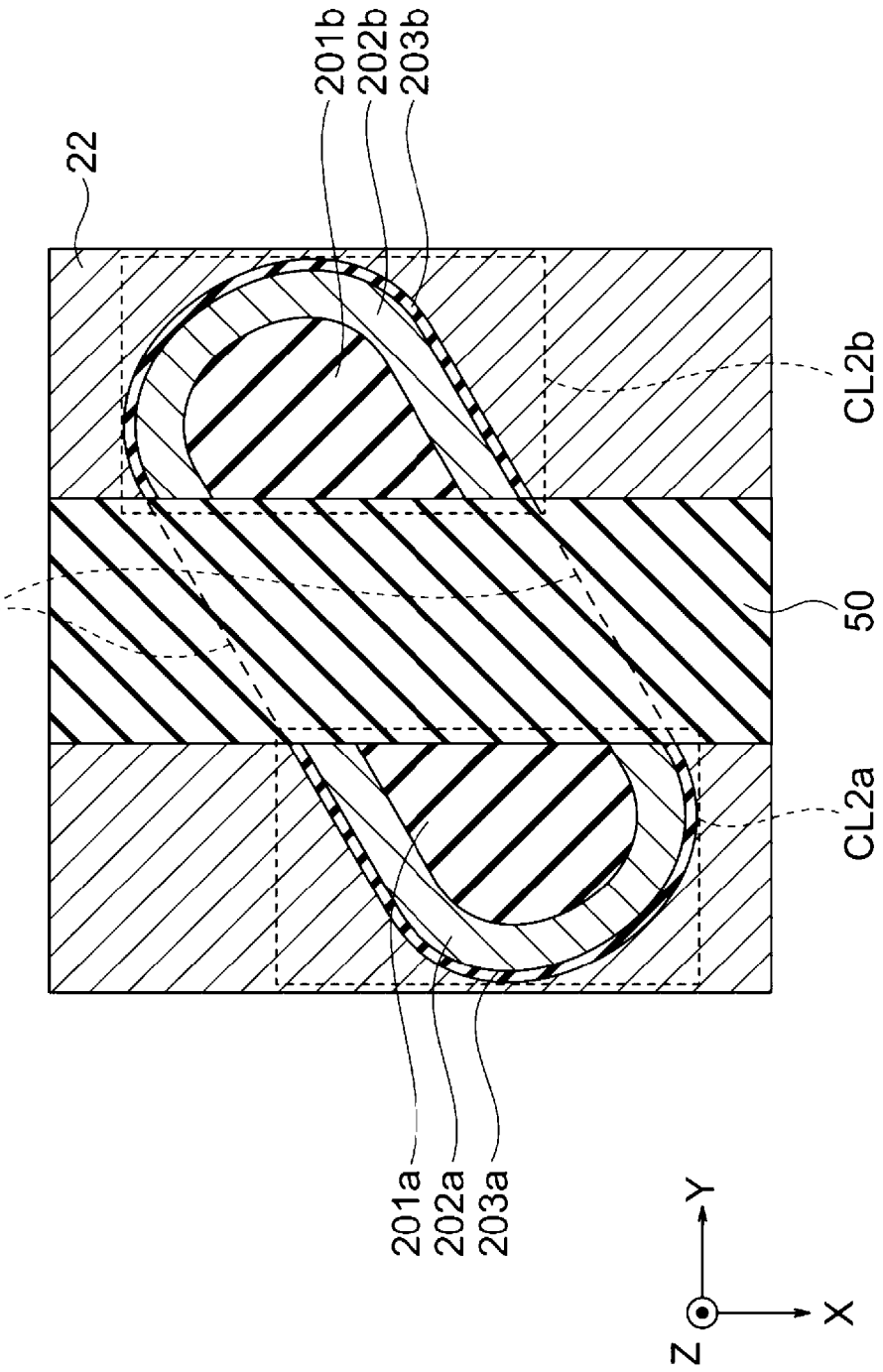

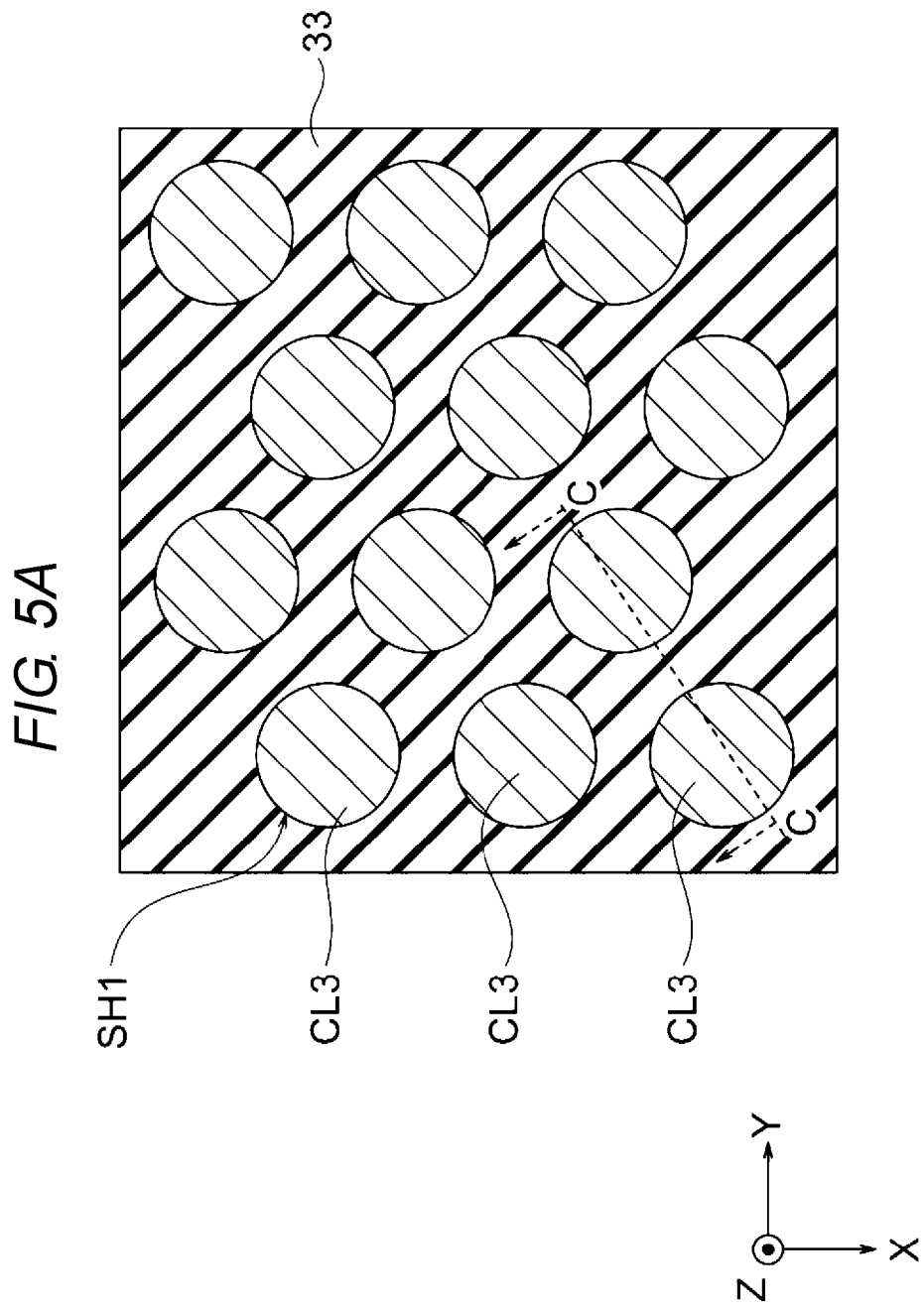

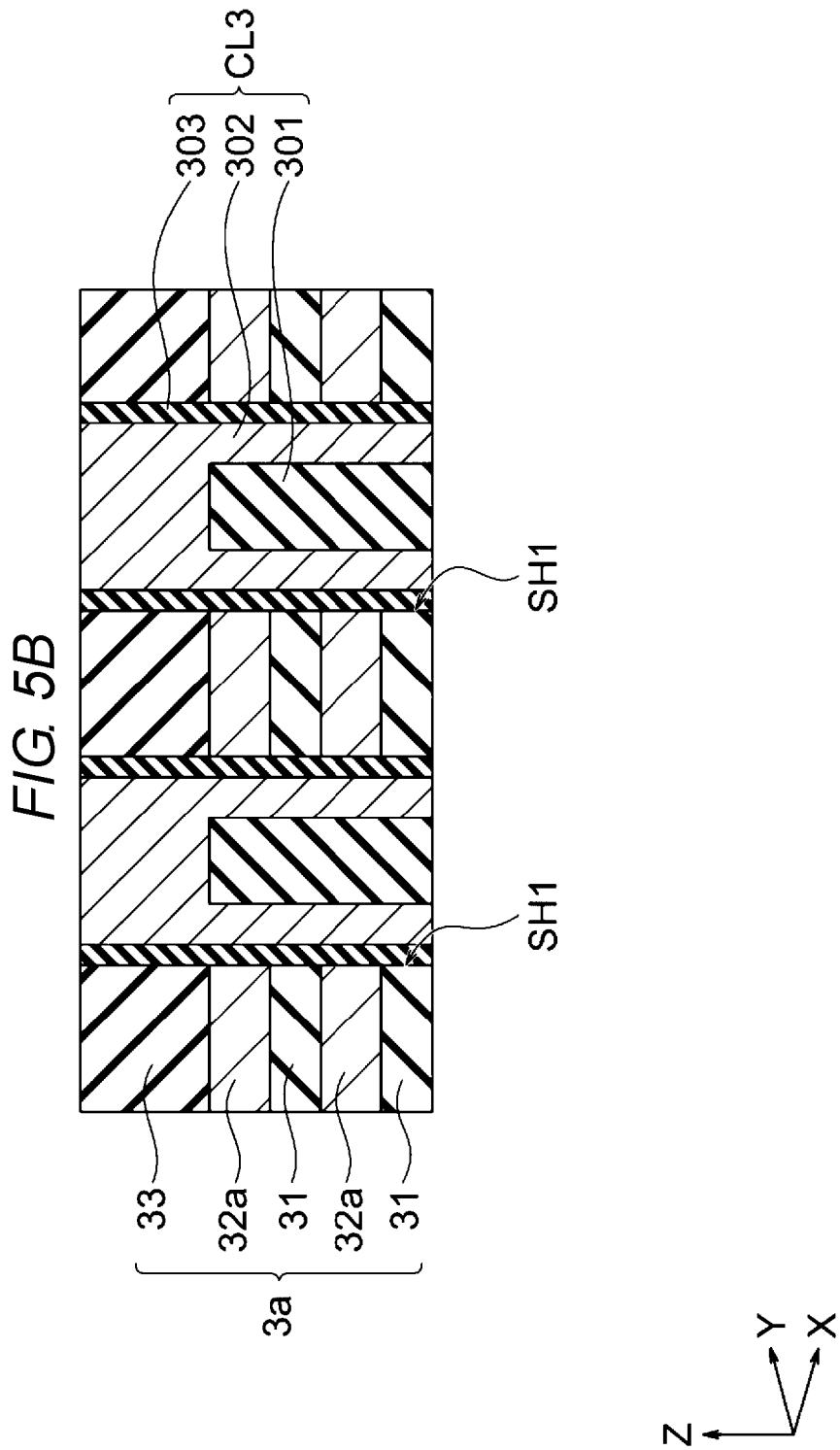

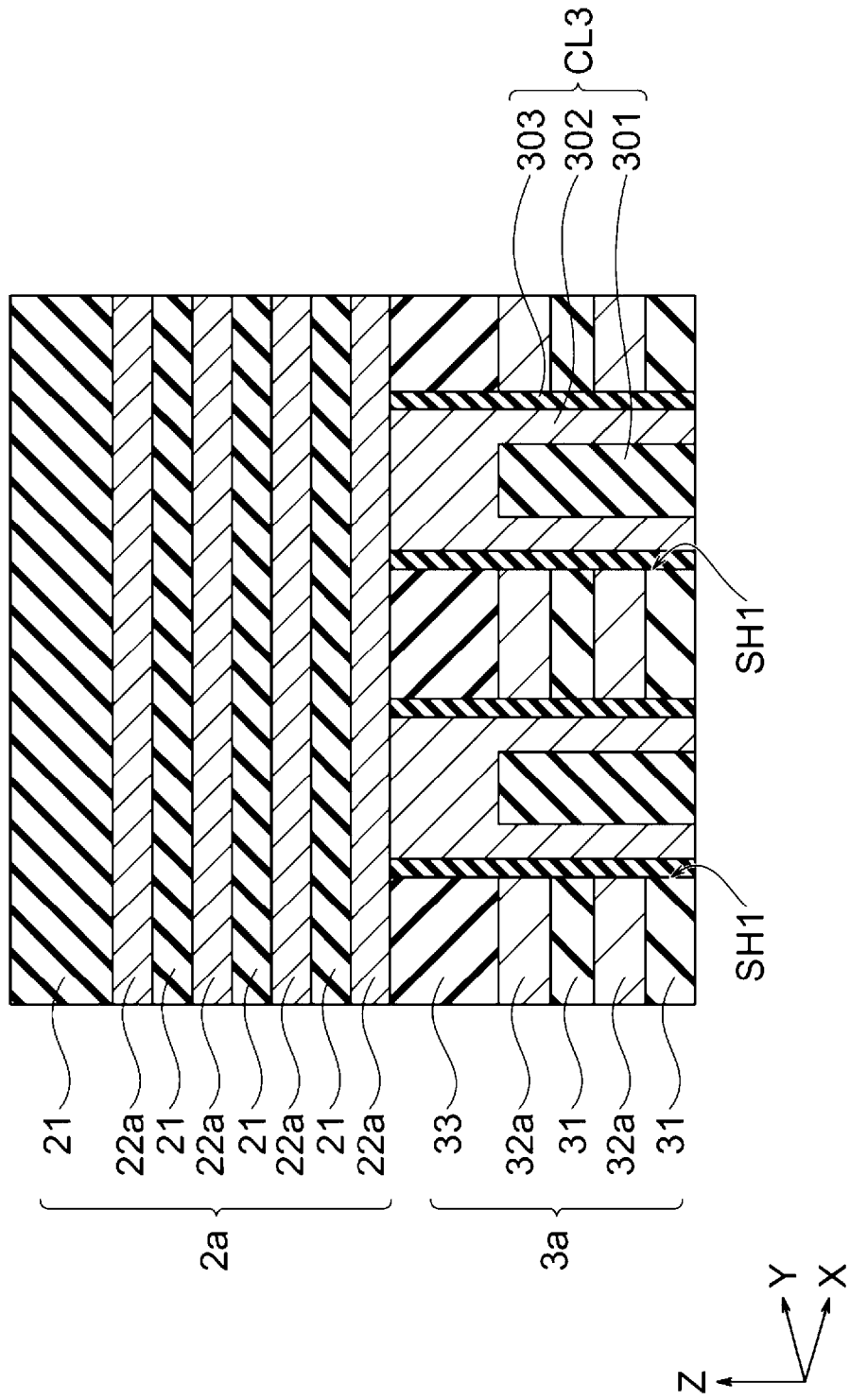

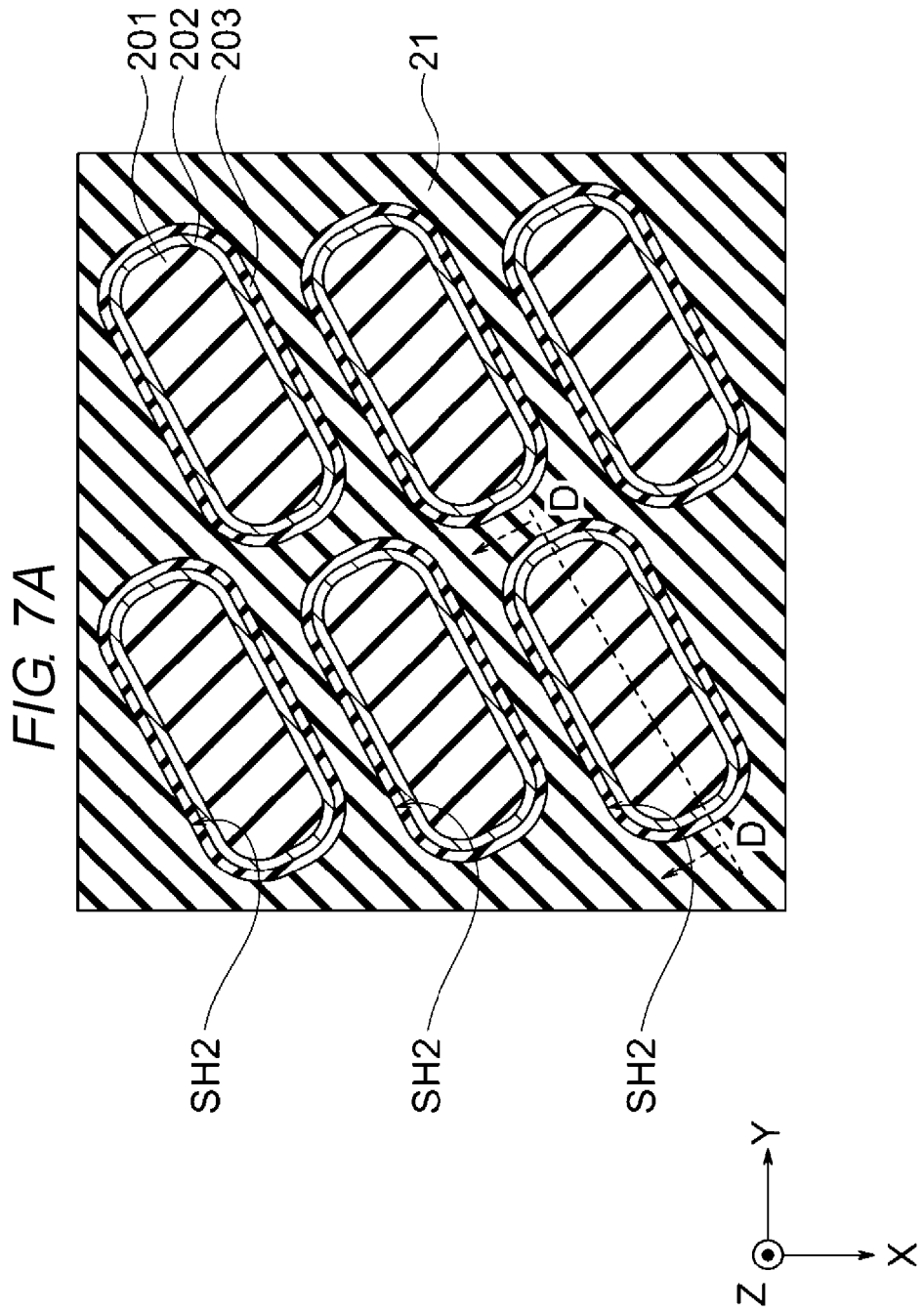

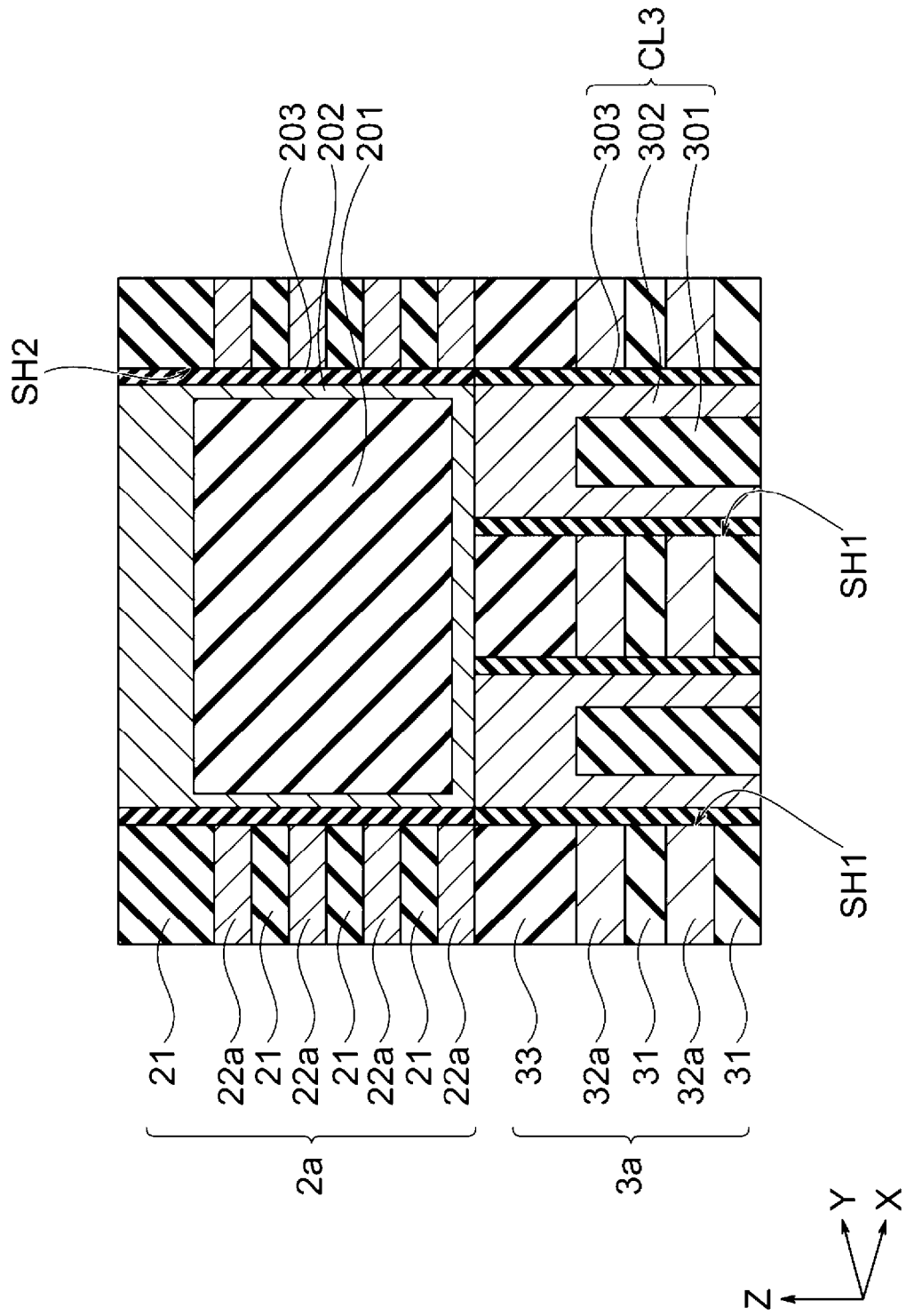

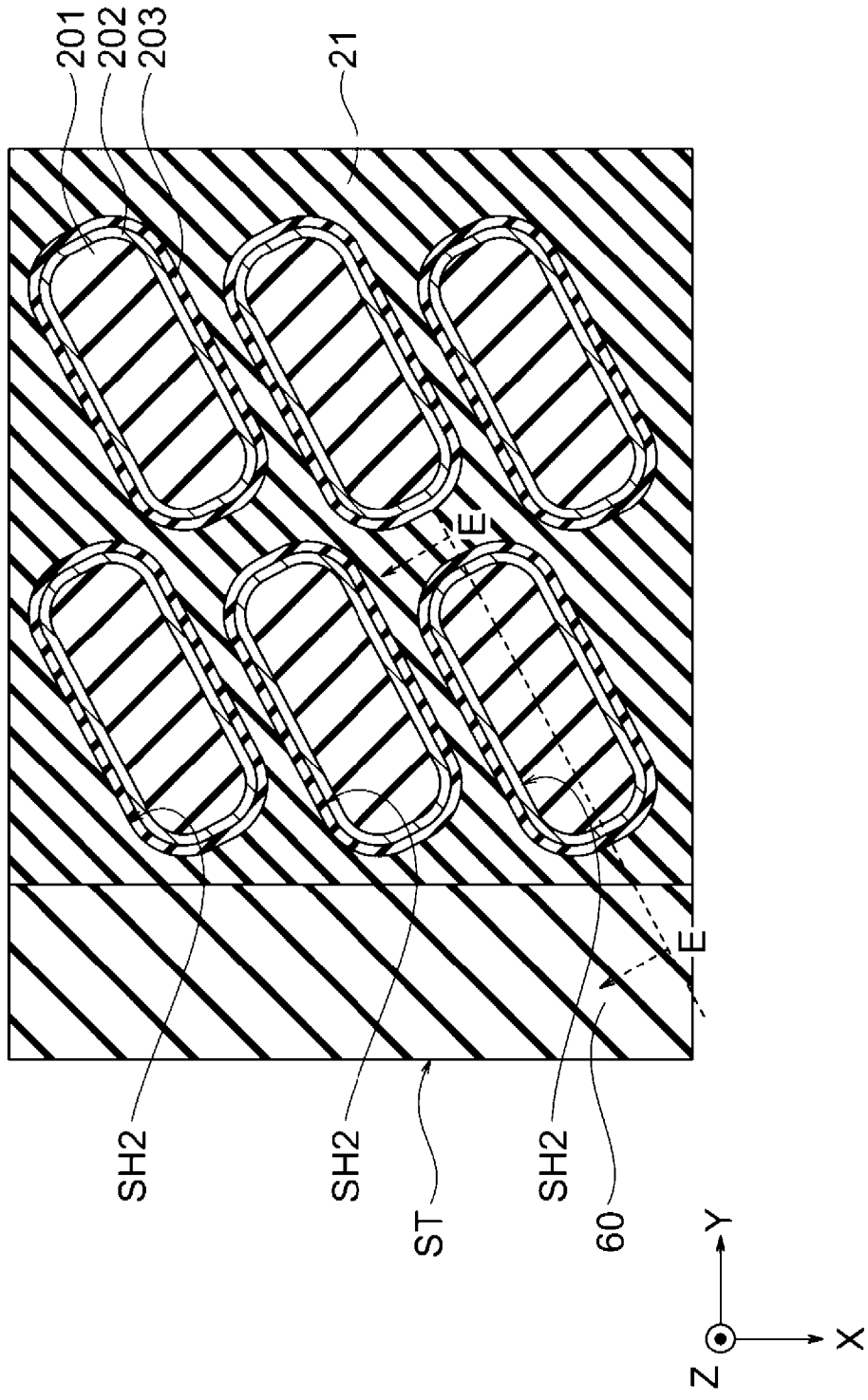

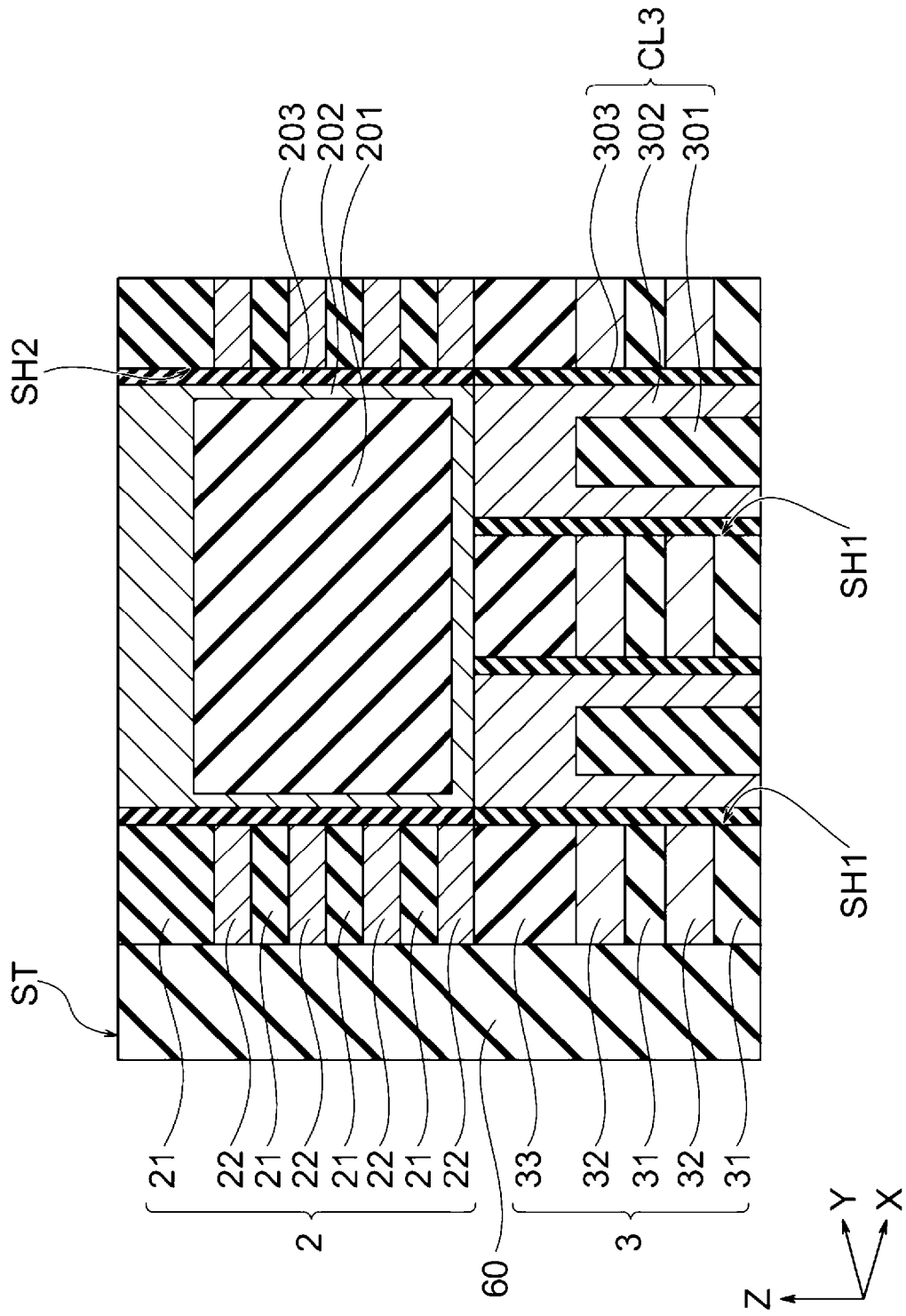

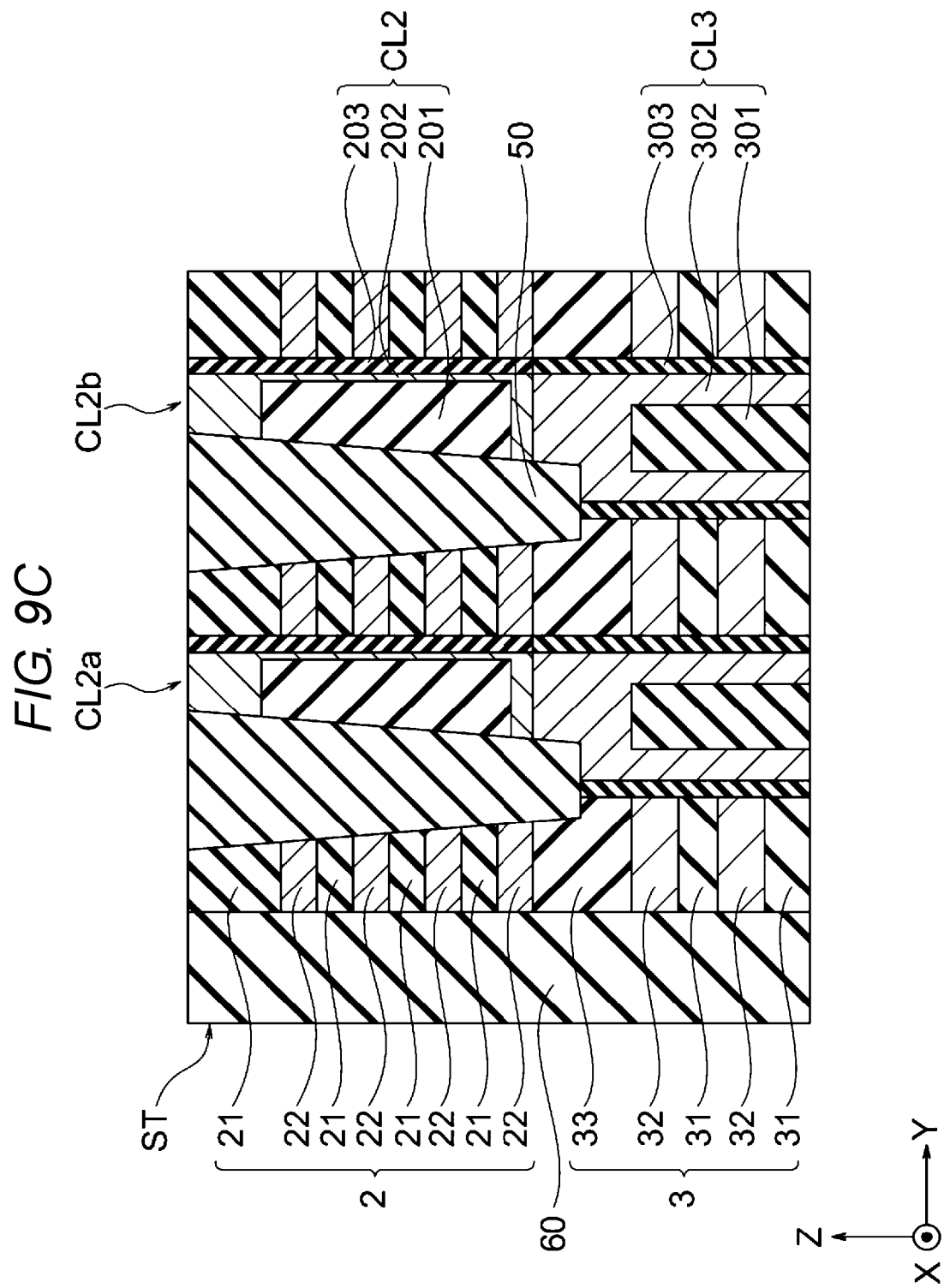

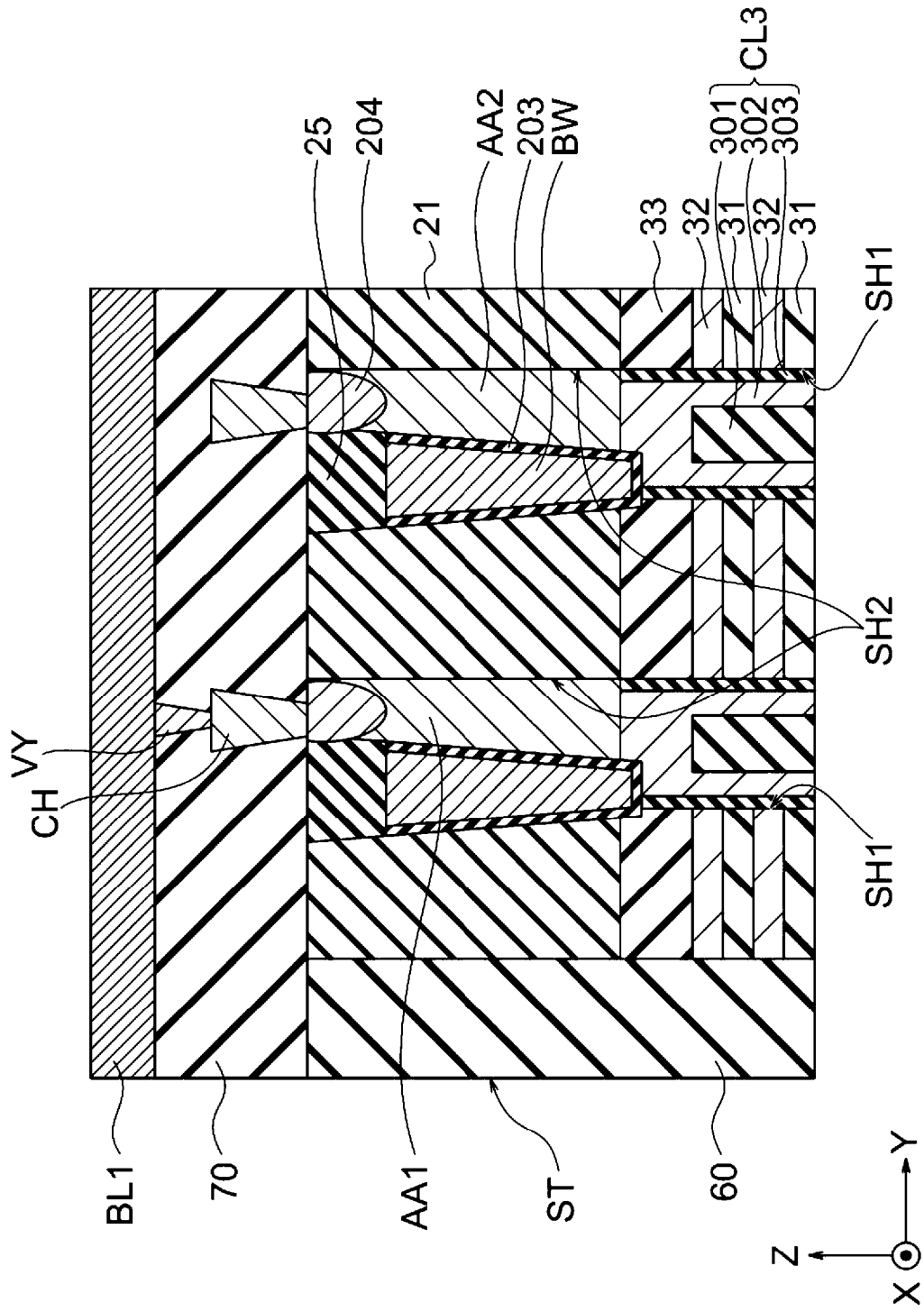

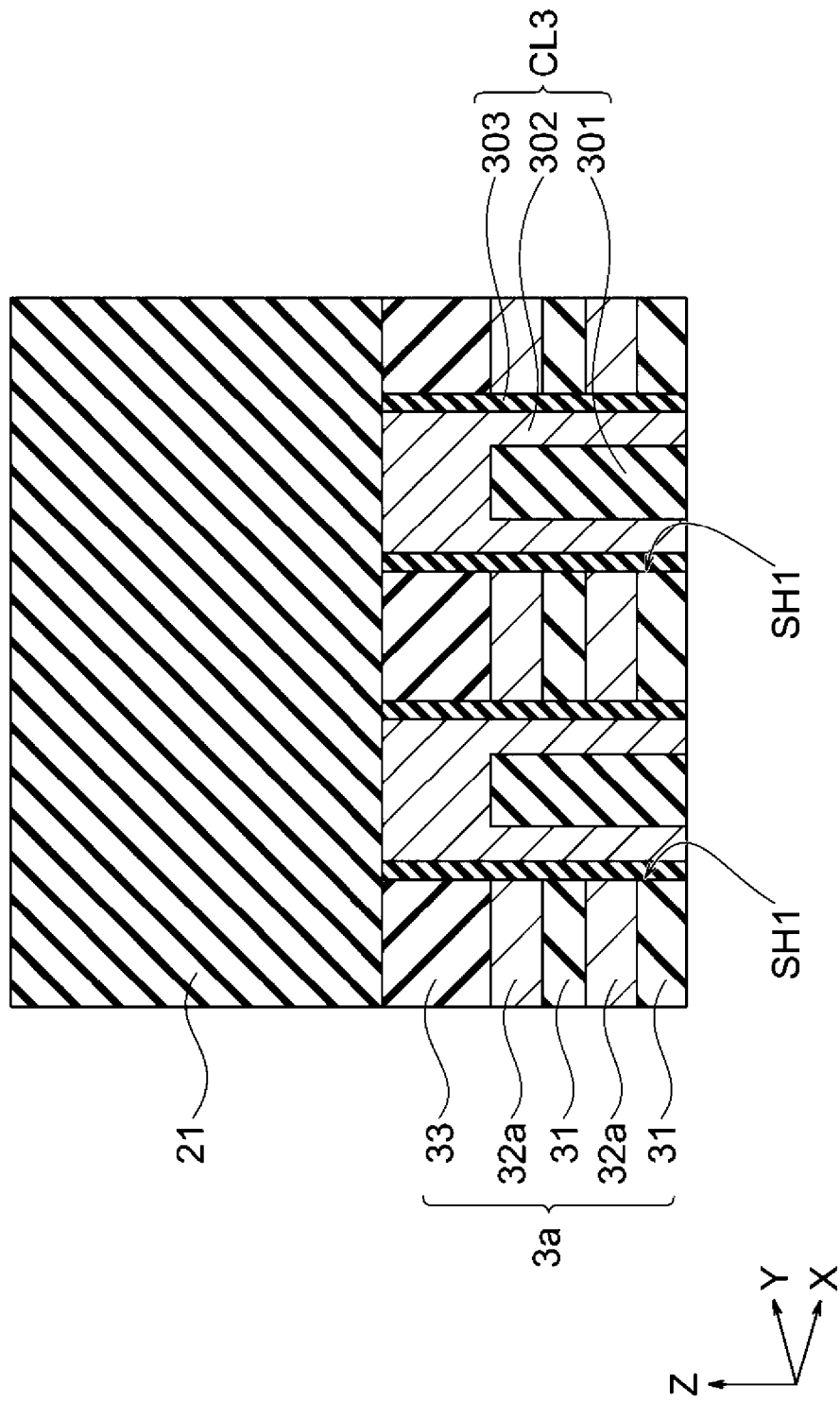

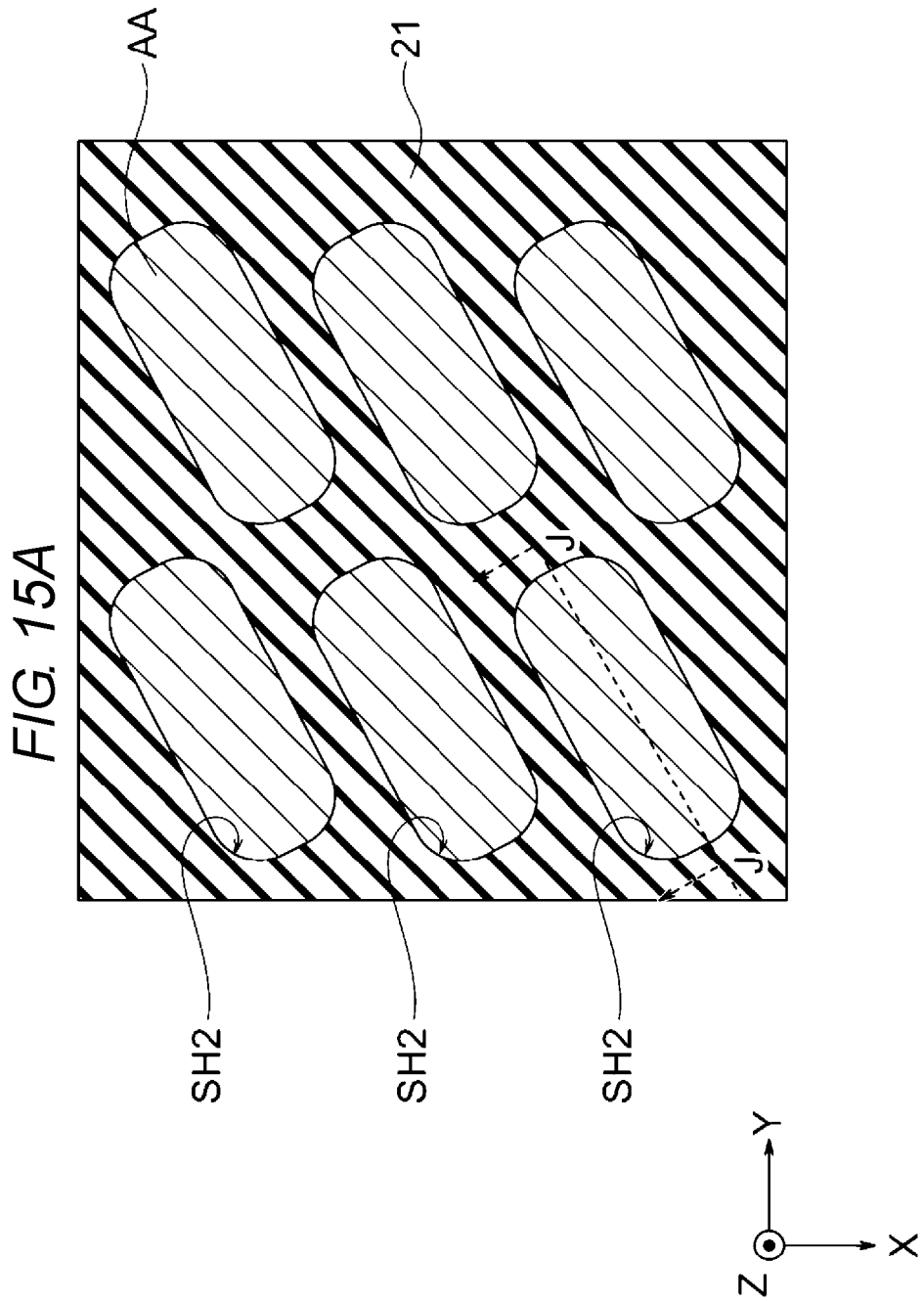

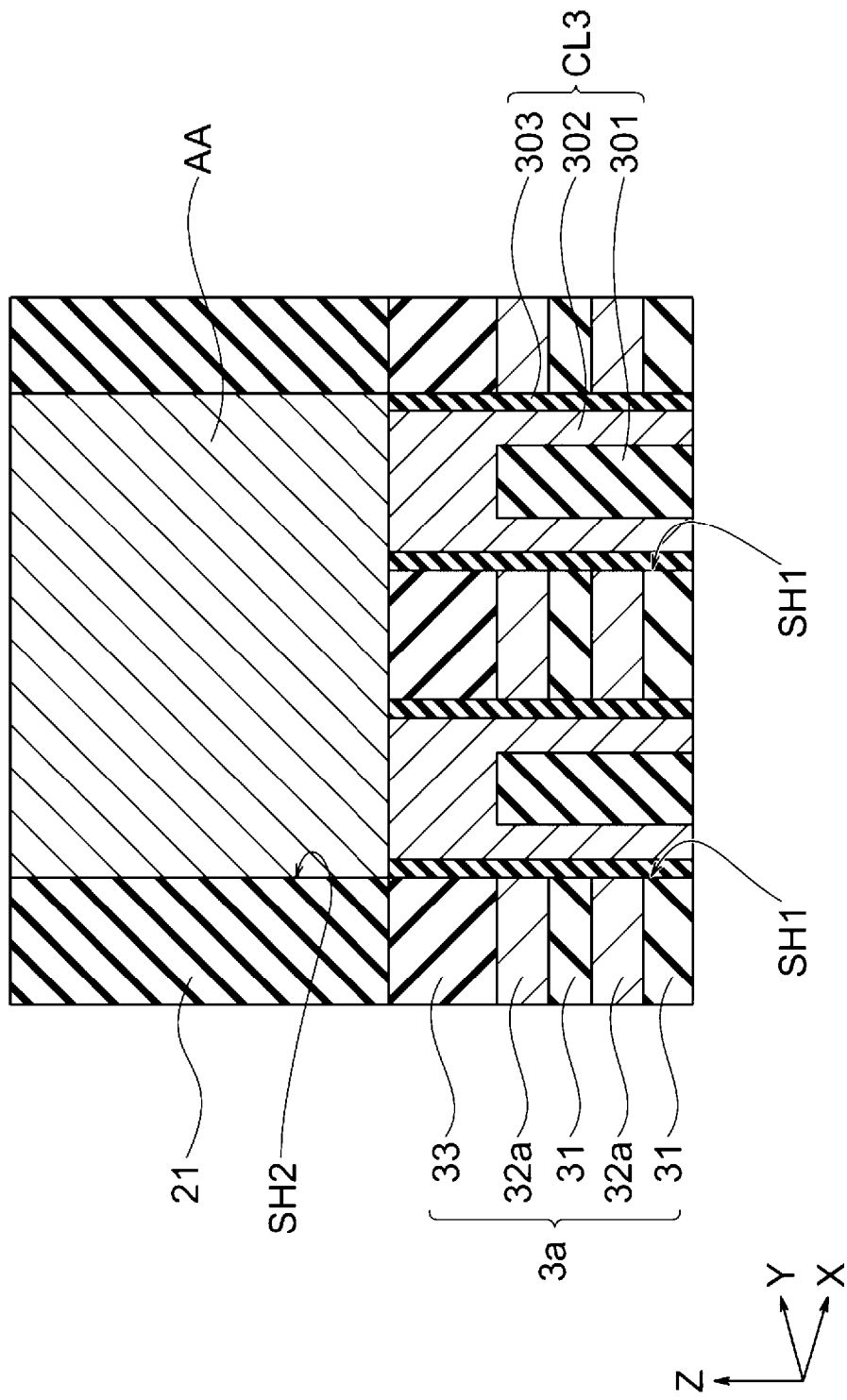

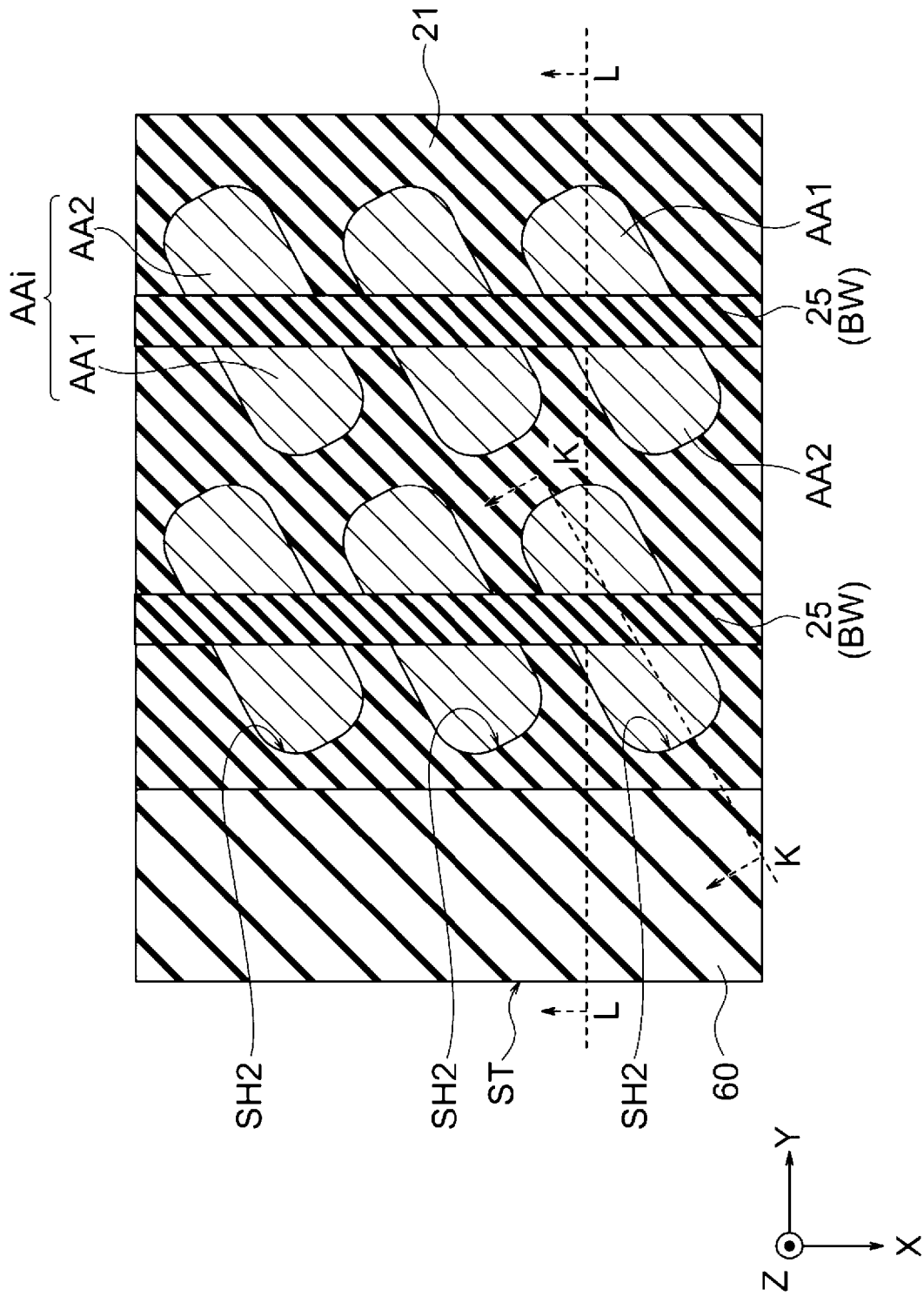

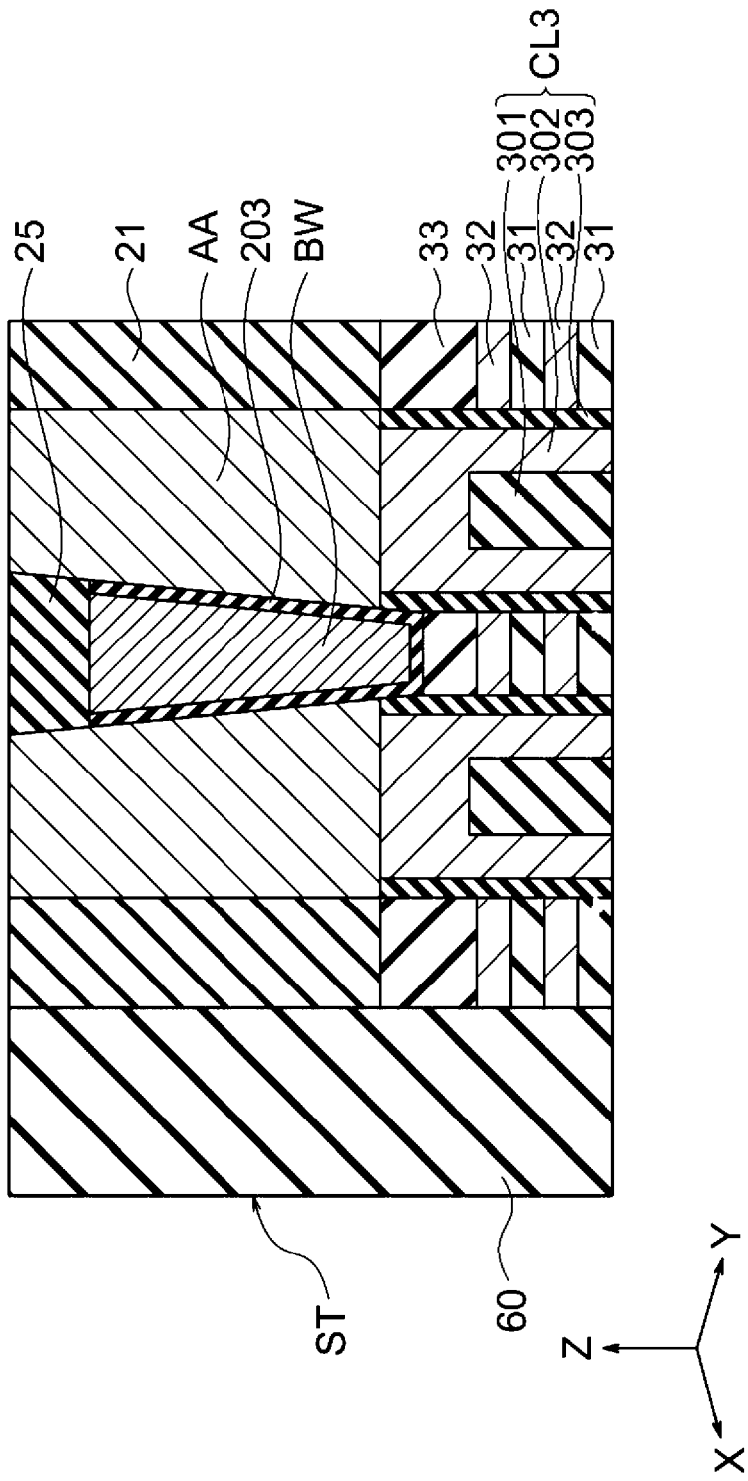

METHOD FOR MANUFACTURING A SEMICONDUCTOR STORAGE DEVICE INCLUDING A DIVISION FILM

CROSS-REFERENCE TO RELATED APPLICATION(S)

This application is based upon and claims the benefit of priority from Japanese Patent Application No. 2021-036506, filed Mar. 8, 2021, the entire contents of which are incorporated herein by reference.

FIELD

Embodiments described herein relate generally to a semiconductor storage device and a method for manufacturing the same.

BACKGROUND

A semiconductor storage device, such as a NAND flash memory, may have a three-dimensional memory cell array in which a plurality of memory cell arrays are arranged three-dimensionally. Select gates are provided in such a three-dimensional memory cell array to select memory strings. However, a memory cell below a slit that divides the select gates is useless because the memory cell cannot store data.

DESCRIPTION OF THE DRAWINGS

FIG. 1B is a schematic plan view illustrating a second stacked body according to the first embodiment;

FIG. 3A is a schematic plan view illustrating a configuration example of a drain-side select gate;

FIG. 3B is a schematic plan view of a region 3B in FIG. 3A;

FIG. 4 is an enlarged schematic plan view of a region 4 in FIG. 3B;

FIG. 5A is a schematic plan view or a schematic cross-sectional view illustrating an example of a method for manufacturing the semiconductor storage device according to the first embodiment;

FIG. 5B is a schematic cross-sectional view taken along line C-C of FIG. 5A;

FIG. 6 is a schematic cross-sectional view illustrating the method for manufacturing the semiconductor storage device following FIG. 5B;

FIG. 7A is a schematic plan view illustrating the method for manufacturing the semiconductor storage device following FIG. 6;

FIG. 7B is a schematic cross-sectional view taken along line D-D of FIG. 7A;

FIG. 8A is a schematic plan view illustrating the method for manufacturing the semiconductor storage device following FIG. 7A;

FIG. 8B is a schematic cross-sectional view taken along line E-E of FIG. 8A;

FIG. 9C is a schematic cross-sectional view taken along line G-G of FIG. 9A;

FIG. 13C is a schematic cross-sectional view taken along line H-H of FIG. 3B;

FIG. 14 is a schematic cross-sectional view illustrating a method for manufacturing the semiconductor storage device according to the second embodiment;

FIG. 15A is a schematic plan view illustrating the method for manufacturing the semiconductor storage device following FIG. 14;

FIG. 15B is a schematic cross-sectional view taken along line J-J of FIG. 15A;

FIG. 16A is a schematic plan view illustrating the method for manufacturing the semiconductor storage device following FIG. 15A;

FIG. 16B is a schematic cross-sectional view taken along line K-K of FIG. 16A;

DETAILED DESCRIPTION

Figure 1A:
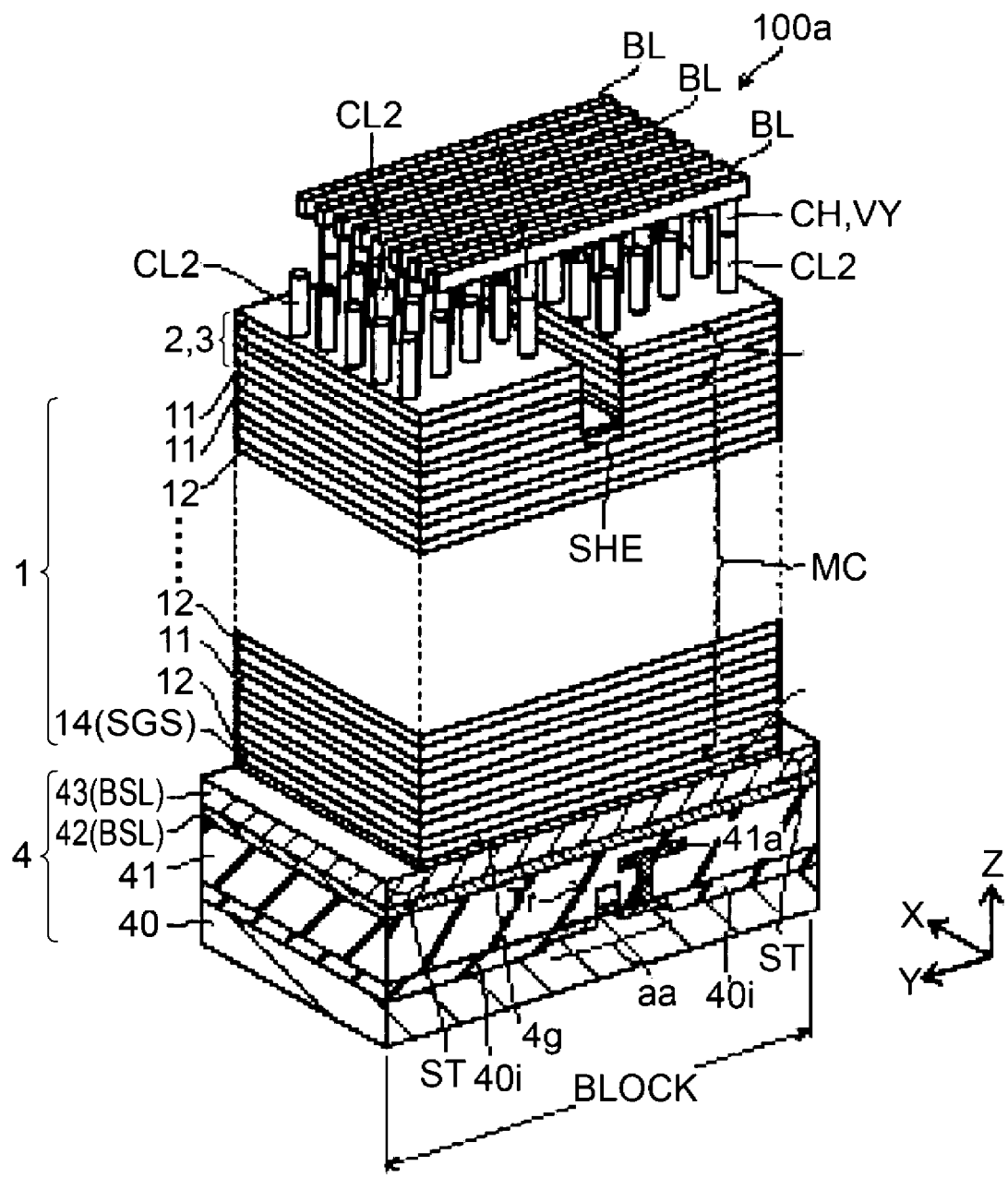
FIG. 1A is a schematic perspective view illustrating a semiconductor storage device according to a first embodiment.

At least one embodiment provides a semiconductor storage device and a method for manufacturing the semiconductor storage device capable of reducing waste of a memory cell array and further miniaturizing the memory cell array.

In general, according to at least one embodiment, a method for manufacturing a semiconductor storage device includes: forming a first stacked body by alternately stacking a first insulating film and a first sacrificial film in a first direction. The method includes forming a first columnar body including a first semiconductor portion stretching in the first direction in the first stacked body and a charge trapping film provided on an outer peripheral surface of the first semiconductor portion. The method includes forming a second columnar body provided in a second direction intersecting the first direction of the first columnar body and including a second semiconductor portion stretching in the first stacked body in the first direction and a charge trapping film on an outer peripheral surface of the second semiconductor portion. The method includes forming a second insulating film above the first stacked body. The method includes forming a third columnar body including a third semiconductor portion provided on both the first columnar body and the second columnar body and stretching in the second insulating film in the first direction and a first gate insulating film provided on an outer peripheral surface of the third semiconductor portion. The method includes forming a first division insulating film extending in the first direction and a third direction intersecting the first direction and the second direction and dividing the third semiconductor portion of the third columnar body in the second direction.

Hereinafter, embodiments of the present disclosure will be described with reference to the drawings. The embodiments are not limited to the present disclosure. In the following embodiments, a vertical direction of a semiconductor substrate indicates a relative direction when a surface on which a semiconductor element is provided is set to face up, and thus, the direction may be different from the vertical direction according to the gravitational acceleration. The drawings are schematic or conceptual, and thus, the ratio of each portion is not always the same as the actual one. In the specification and the drawings, the same components as those described above with respect to the existing drawings are denoted by the same reference numerals, and detailed description thereof will be omitted as appropriate.

First Embodiment

FIG. 1A is a schematic perspective view illustrating a configuration example of a semiconductor storage device 100a according to a first embodiment. FIG. 1B is a schematic plan view illustrating a configuration example of a second stacked body 2. The semiconductor storage device 100a according to the embodiment is a non-volatile memory having a memory cell having a three-dimensional structure. A stacking direction of the second stacked body 2 is set as a Z direction, a direction intersecting the Z direction, for example, one orthogonal direction is set as a Y direction, and a direction orthogonal to the Z direction and the Y direction is set as an X direction.

As illustrated in FIG. 1A, the semiconductor storage device 100a includes a wiring structure provided above a first stacked body 1, a second stacked body 2, a third stacked body 3, a base portion 4, and a second stacked body 2. The wiring structure includes, for example, contacts VY and CH and a plurality of bit lines BL.

The first stacked body 1 includes a first insulating film 11 and a first conductive film 12 which are provided above the base portion 4 and are alternately stacked along the Z direction. For example, an insulator such as silicon oxide ($SiO_2$) is used for the first insulating film 11. For example, a conductive metal such as tungsten (W) is used for the first conductive film 12. The first insulating film 11 insulates the first conductive films 12 adjacent to the top and bottom in the Z direction. The number of layers of the first insulating film 11 and the first conductive film 12 may be any number. An insulating film 4g is provided between the first stacked body 1 and a base semiconductor portion 43.

Although not illustrated in FIG. 1A, a columnar body CL1 is provided in the first stacked body 1 to stretch in the Z direction. A memory cell MC is provided corresponding to the intersection of the columnar body CL1 and the first conductive film 12.

The second stacked body 2 is provided above the first stacked body 1. The third stacked body 3 is provided between the first stacked body 1 and the second stacked body 2. A columnar body CL2 penetrates the second stacked body 2 and is provided with a drain-side select gate SGDO. Although not illustrated in FIG. 1A, a columnar body CL3 penetrates the third stacked body 3 and is provided with a drain-side select gate SGD. The two columnar bodies CL2 and CL3 are provided corresponding to each columnar body CL1 and are continuous on the corresponding columnar body CL1. Therefore, the columnar body CL3 is connected on the first columnar body CL1, and the columnar body CL2 is connected on the columnar body CL3. The drain-side select gates SGDO and SGD are configured so that the corresponding columnar body CL1 (memory string) can be selectively connected to the bit line BL. More detailed configurations of the second and third stacked bodies 2 and 3 and the drain-side select gates SGDO and SGD will be described later.

The base portion 4 is provided below the first stacked body 1 and includes a substrate 40, a base insulating film 41, a base conductive film 42, and a base semiconductor portion 43. The substrate 40 has a first surface and a second surface that are substantially perpendicular to the Z direction, which is the stacking direction. The base insulating film 41 is provided on the first surface of the substrate 40. The base conductive film 42 is provided on the base insulating film 41. The base semiconductor portion 43 is provided on the base conductive film 42. The substrate 40 is configured with a semiconductor substrate, and may be, for example, a p-type silicon substrate. For example, an element division region 40i is provided on the surface region of the substrate 40. The element division region 40i is, for example, an insulating region containing silicon oxide, and an active area aa is partitioned on the surface region of the substrate 40. The source and drain regions of a transistor Tr are provided in the active area aa. The transistor Tr configures a peripheral circuit of the non-volatile memory. The base insulating film 41 contains, for example, a silicon oxide and insulates the transistor Tr. A wiring 41a is provided in the base insulating film 41. The wiring 41a is a wiring electrically connected to the transistor Tr. For example, a conductive metal such as tungsten is used for the base conductive film 42. For example, a semiconductor material such as n-type silicon is used for the base semiconductor portion 43. Undoped silicon may be used for a portion of the base semiconductor portion 43. The base conductive film 42 and the base semiconductor portion 43 integrally function as a common source line BSL of the memory cell array.

Some conductive films 14 of the first stacked body 1 close to the base portion 4 are used for the source-side select gate SGS. A word line WL is provided between the source-side select gate SGS and the drain-side select gates SGDO and SGD.

The memory cell MC is connected in series between the source-side select gate SGS and the drain-side select gates SGDO and SGD. The structure in which the source-side select gate SGS, the memory cell MC, and the drain-side select gates SGDO and SGD are connected in series is called a memory string or a NAND string. The memory string is connected to a wiring BL via the contacts CH and VY, for example, as described later. The contacts CH and VY are provided on each columnar body CL2 and are connected between the columnar body CL2 and the bit line BL. The wiring BL is provided above the second stacked body 2 and stretches in the Y direction. The drain-side select gate SGDO provided in the columnar body CL2 can selectively connect the columnar body CL1 to the bit line BL.

In some cases, the drain-side select gates SGDO and SGD may indicate the gate electrode of the drain-side select transistor or the drain-side select transistor itself.

As illustrated in FIG. 1B, a slit ST stretches in the X direction in a plan view seen from the Z direction. The slit ST penetrates the second stacked body 2, the third stacked body 3, and the first stacked body 1 from the upper end of the second stacked body 2 through the base portion 4 in the Z direction and reaches a buried source line BSL. The slit ST is filled with an insulating material such as a silicon oxide film. Accordingly, the slit ST electrically divides the first to third stacked bodies 1 to 3 for each block BLOCK described later. Therefore, hereinafter, in some cases, the slit ST may also be referred to as a division insulating film 60. In some cases, the slit ST may also be configured with an insulating film (not illustrated) provided on the inner wall thereof and a conductive film that is electrically insulated from the stacked bodies 1 to 3 by the insulating film and is electrically connected to the buried source line BSL buried in the slit ST. Here, the slit ST is also used as a wiring for connecting the buried source line BSL while electrically dividing the stacked bodies 1 to 3 for each block BLOCK.

On the other hand, a first division insulating film 50 stretches in the X direction substantially parallel to the division insulating film 60 in a plan view seen from the Z direction. The first division insulating film 50 is a shallow slit that penetrates from the upper end to the lower end of the stacked body 2 in the Z direction, but does not reach the stacked bodies land 3. That is, the first division insulating film 50 penetrates the stacked body 2 provided with the drain-side select gate SGDO in the Z direction, but does not penetrate the stacked bodies 1 and 3 below the stacked body 2. An insulating material such as silicon oxide is buried in the first division insulating film 50. Accordingly, the first division insulating film 50 divides the drain-side select gate SGDO provided in the second stacked body 2 in units (hereinafter, also referred to as fingers) finer than the block BLOCK.

As illustrated in FIG. 1B, in a plan view seen from the Z direction, the first stacked body 1, the second stacked body 2, and the third stacked body 3 include a staircase portion 2s and a memory cell array 2m. In the staircase portion 2s, the memory cell array 2m is interposed between or surrounded by the staircase portion 2s. The slit ST is provided from the staircase portion 2s at one end of the stacked bodies 1 to 3 to the staircase portion 2s at the other end of the stacked body over the memory cell array 2m. The portion of the stacked bodies 1 to 3 interposed between the slits ST is called a block BLOCK. The block configures, for example, the smallest unit of data erasure. As described above, the block BLOCK is further partitioned in finer units by the first division insulating film 50. The on/off state of the drain-side select gate SGDO can be controlled in units (fingers) partitioned by the first division insulating film 50. The finger is a unit at the time of writing and reading data. By selecting the drain-side select gate SGDO corresponding to one finger in the block, the data of the memory cell corresponding to the finger can be read or written at a time. The layout of the memory cell array 2m and the staircase portion 2s is not limited thereto, and any layout may be designed.

Figure 2A:
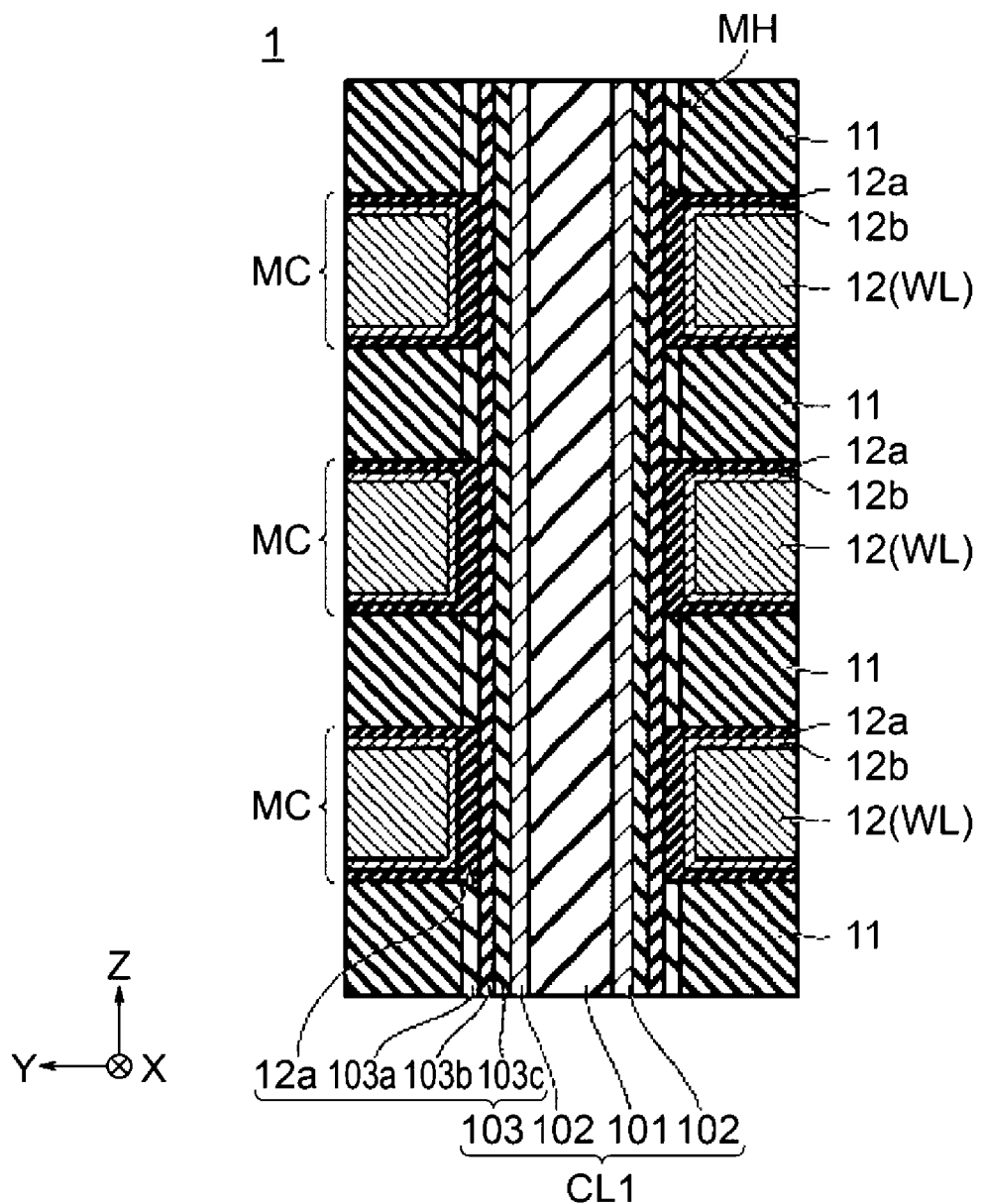
FIG. 2A is a schematic cross-sectional view illustrating a memory cell having a three-dimensional structure in a first stacked body according to the first embodiment.
Figure 2B:
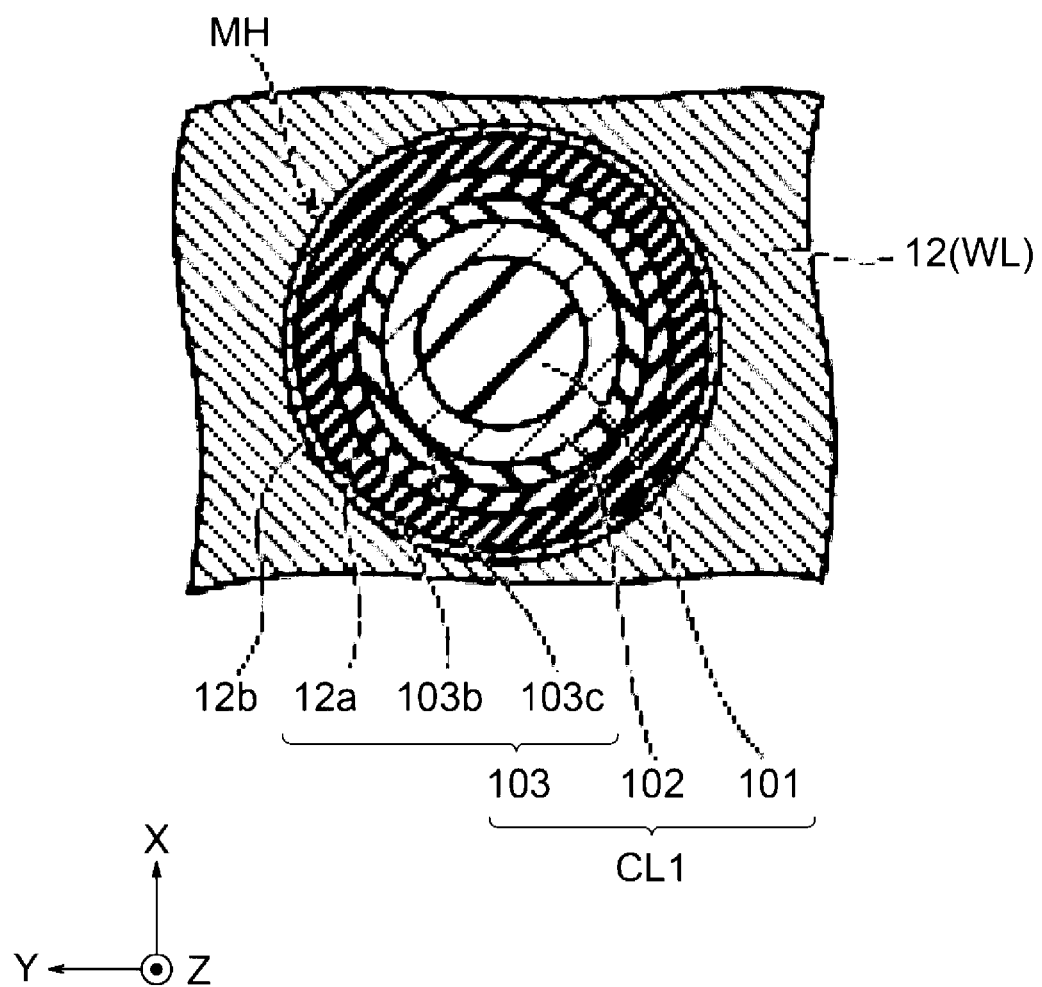
FIG. 2B is a schematic cross-sectional view illustrating a memory cell having a three-dimensional structure in the first stacked body according to the first embodiment.

FIGS. 2A and 2B are schematic cross-sectional views illustrating a memory cell having a three-dimensional structure in the first stacked body according to the first embodiment, and each of the plurality of columnar bodies CL1 is provided in a memory hole MH provided in the first stacked body 1. The memory hole MH penetrates the first stacked body 1 from the upper end of the first stacked body 1 along the Z direction and straddle the substrate 40. Therefore, a plurality of the memory cells MC are provided corresponding to the intersections of the first conductive film 12 and the columnar body CL1 in the first stacked body 1. Each of the plurality of columnar bodies CL1 includes a first insulator column 101 stretching in the first stacked body 1 in the stacking direction of the first stacked body 1, a semiconductor portion 102 provided on an outer periphery of the first insulator column 101, and a charge trapping film 103 provided on an outer periphery of the semiconductor portion 102. The semiconductor portion 102 is electrically connected to the base semiconductor portion 43 of the base portion 4. It is noted that the charge trapping film 103 includes a cover insulating film 103a, a charge trapping portion 103b, and a tunnel insulating film 103c for the plurality of memory cells MC.

As illustrated in FIG. 2B, the shape of the memory hole MH in an XY plane is substantially circular. In other words, the cross section in the direction substantially perpendicular to the stacking direction of the columnar body CL1 is substantially circular. A block insulating film 12a configuring a portion of the charge trapping film 103 may be provided between the first insulating film 11 and the first conductive film 12. The block insulating film 12a is, for example, a silicon oxide film or a metal oxide film. The metal oxide film may be made of, for example, aluminum oxide. A barrier film 12bb may be provided between the first insulating film 11 and the first conductive film 12 and between the first conductive film 12 and the charge trapping film 103. When the first conductive film 12 is made of tungsten, the barrier film 12bb may be, for example, a stacked structure film of titanium nitride (TiN) and titanium (Ti). The block insulating film 12a prevents back tunneling of charges from the first conductive film 12 to the charge trapping film 103 side. The barrier film 12bb improves the adhesion between the first conductive film 12 and the block insulating film 12a.

The shape of the semiconductor portion 102 may be, for example, a cylindrical shape having a bottom. The semiconductor portion 102 contains, for example, silicon. The silicon may be, for example, polysilicon obtained by crystallizing amorphous silicon. The semiconductor portion 102 is made of, for example, undoped silicon. The semiconductor portion 102 may be p-type silicon. The semiconductor portion 102 functions as a channel region of the memory cell MC and the source-side select gate SGS.

In the charge trapping film 103, a portion other than the block insulating film 12a is provided between the inner wall of the memory hole MH and the semiconductor portion 102. The shape of the charge trapping film 103 is, for example, a cylindrical shape. The plurality of memory cells MC have a storage area between the semiconductor portion 102 and the first conductive film 12 serving as the word line WL and are stacked in the Z direction. The charge trapping film 103 includes, for example, a cover insulating film 103a, a charge trapping portion 103b, and a tunnel insulating film 103c. Each of the semiconductor portion 102, the charge trapping portion 103b, and the tunnel insulating film 103c extends in the Z direction.

The cover insulating film 103a is provided between the first insulating film 11 and the charge trapping portion 103b. The cover insulating film 103a contains, for example, silicon oxide. The cover insulating film 103a protects the charge trapping portion 103b from being etched in the replacing process of the first conductive film 12 in the manufacturing process of the semiconductor storage device described later. The cover insulating film 103a may be removed from between the first conductive film 12 and the charge trapping film 103 in the replacing process. For example, the block insulating film 12a is provided between the first conductive film 12 and the charge trapping portion 103b. When the replacing process is not performed in the formation of the first conductive film 12, the cover insulating film 103a may not be provided.

The charge trapping portion 103b is provided between the block insulating film 12a and the tunnel insulating film 103c and between the cover insulating film 103a and the tunnel insulating film 103c. The charge trapping portion 103b contains, for example, silicon nitride (SiN) and has a trap site that traps charges in the film. The portion of the charge trapping portion 103b interposed between the first conductive film 12 serving as the word line WL and the semiconductor portion 102 configures the storage area of the memory cell MC. A threshold voltage of the memory cell MC changes depending on the existence or absence of electric charges in the storage area or the amount of electric charges trapped in the storage area. Therefore, the memory cell MC stores the information.

The tunnel insulating film 103c is provided between the semiconductor portion 102 and the charge trapping portion 103b. The tunnel insulating film 103c contains, for example, silicon oxide, or silicon oxide and silicon nitride. The tunnel insulating film 103c is a potential barrier between the semiconductor portion 102 and the charge trapping portion 103b. For example, when electrons are implanted from the semiconductor portion 102 into the storage area (writing operation) and when holes are injected from the semiconductor portion 102 into the storage area (erasing operation), the electrons and the holes pass through (tunneling) the potential barrier of the tunnel insulating film 103c, respectively.

As described above, the charge trapping film 103 includes the cover insulating film 103a, the charge trapping portion 103b, and the tunnel insulating film 103c. Therefore, the charge trapping film 103 is configured with a stacked film of a silicon oxide film, a silicon nitride film, and a silicon oxide film. The first insulator column 101 buries the internal space of the cylindrical semiconductor portion 102. The shape of the first insulator column 101 is, for example, a columnar shape. The first insulator column 101 contains, for example, silicon oxide and has an insulating property.

Next, the configuration of the drain-side select gates SGDO and SGD will be described.

FIG. 3A is a schematic plan view illustrating a configuration example of the drain-side select gate SGDO. FIG. 3B is a schematic plan view of a region 3B in FIG. 3A.

The columnar bodies CL2 are arranged two-dimensionally in a plan view seen from the stacking direction (Z direction) of the second stacked body 2. As described above, the columnar body CL2 is provided correspondingly on the columnar body CL1. Therefore, in a plan view seen from the Z direction, the columnar body CL2 overlaps the columnar body CL1 and has the same two-dimensional arrangement as the columnar body CL1. It is noted that, in FIG. 3A, the columnar bodies CL2 are arranged in a 12-row staggered arrangement in the block BLOCK in the Y direction, but the number of columnar bodies CL2 in the block BLOCK is not particularly limited and may be any number.

The division insulating film 60 (deep slit ST) electrically divides the stacked bodies 1 to 3 for each block BLOCK. The division insulating film 60 is buried in the deep slit ST.

Figure 3C:
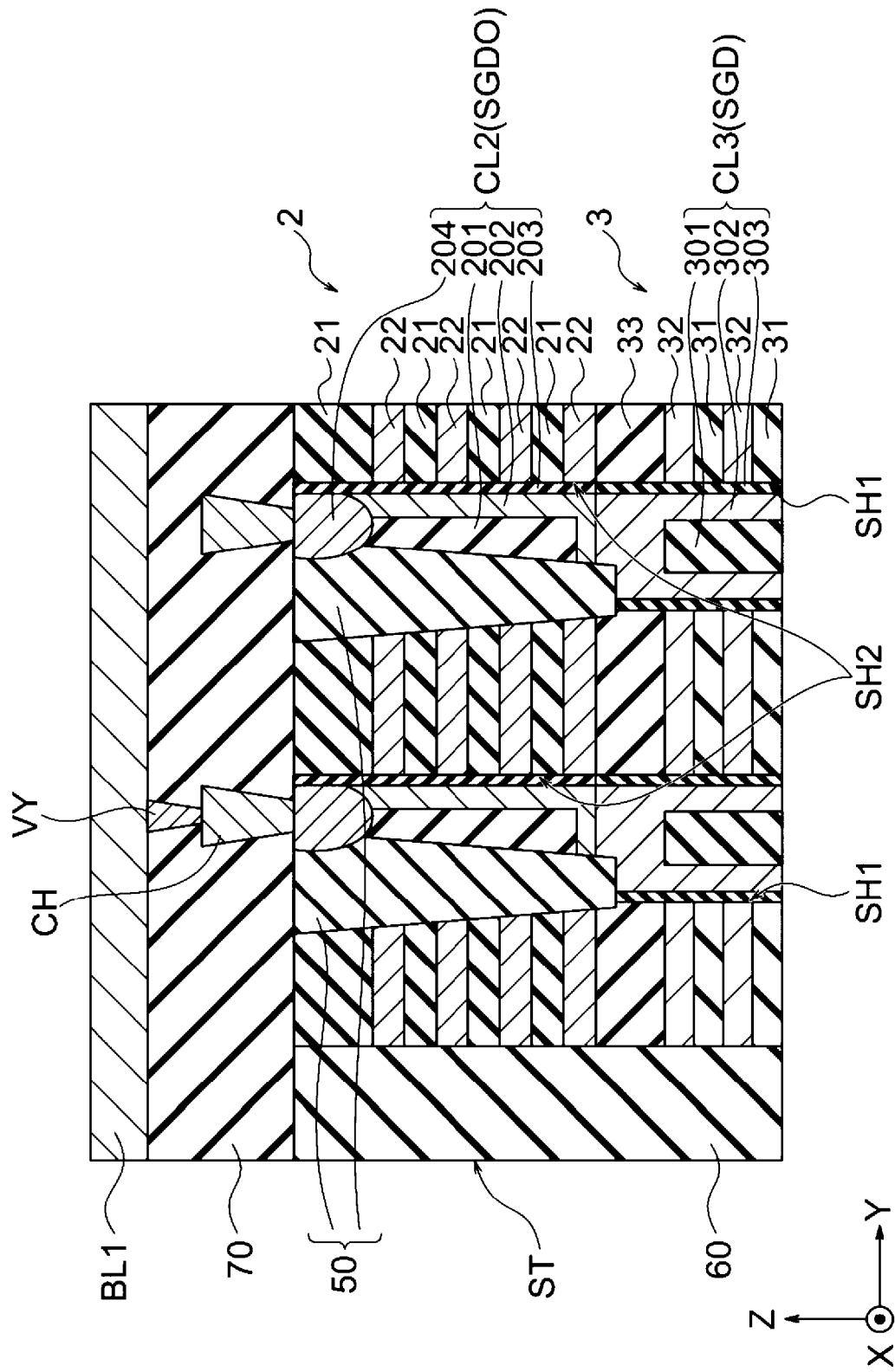
FIG. 3C is a schematic cross-sectional view taken along line A-A in FIG. 3B.

The plurality of first division insulating films 50 are provided between two adjacent division insulating films 60 to be substantially parallel to the division insulating films 60 and electrically divide second conductive films 22 of the second stacked body 2 illustrated in FIG. 3C. In a plan view seen from the Z direction, the plurality of first division insulating films 50 and the plurality of second conductive films 22 of the second stacked body 2 are alternately arranged in a striped shape. The configuration of the second stacked body 2 will be described later with reference to FIGS. 3C and 3D.

The columnar body CL2 is originally formed as an active area having a substantially oblate shape, a substantially elliptical shape, or a substantially rectangular shape having a major axis or a minor axis in an inclined direction inclined in the X and Y directions. The active area is divided by the first division insulating film 50 to form a pair of two columnar bodies CL2. Hereinafter, the columnar body CL2 having a substantially oblate shape, a substantially elliptical shape, or a substantially rectangular shape is referred to as an initial columnar body CL2i.

The first division insulating film 50 skewers the initial columnar body CL2i in the X direction in a plan view seen from the Z direction, and the initial columnar body CL2i is divided into two. Accordingly, the initial columnar body CL2i is divided into two. That is, in the middle of the manufacturing process, the initial columnar body CL2i has a substantially oblate shape, a substantially elliptical shape, or a substantially rectangular shape and is divided into two by the formation of the first division insulating film 50 to form a pair (CL2a and CL2b) of the columnar bodies CL2. Hereinafter, the initial columnar body CL2i divided by the first division insulating film 50 is also referred to as a pair of the columnar bodies CL2a and CL2b. Therefore, in the finished product, each pair of the columnar bodies CL2a and CL2b has the shape of a portion (both end portions) of the initial columnar body CL2i divided by the first division insulating film 50.

The second conductive film 22 of the second stacked body 2 illustrated in FIG. 3C is provided between the adjacent first division insulating films 50 and provided between a plurality of the initial columnar bodies CL2i adjacent to each other in an inclined direction with respect to the X or Y direction. Accordingly, the second conductive film 22 and the first division insulating film 50 of the second stacked body 2 are alternately arranged in a striped shape in a plan view seen from the Z direction. The second conductive film 22 covers a portion of the outer periphery of the columnar body CL2.

The contact CH illustrated in FIG. 3B is provided on each columnar body CL2, and the contact VY is provided on the contact CH. The contact VY is connected to bit lines BL1 to BL4 stretching in the Y direction. Accordingly, the data from each memory string is read out via the columnar body CL2, the contacts CH and VY, and the bit lines BL1 to BL4.

In a plan view seen from the Z direction, the contact CH is, for example, a substantially elliptical shape having a major axis in the X direction orthogonal to the stretching direction of the bit line BL. In a plan view seen from the Z direction, the contact VY may be substantially circular, but the contact VY may be substantially elliptical. Here, the major axis of the contact VY may be in the same direction (X direction) as the major axis of the contact CH. Accordingly, since the contact VY spreads in the X direction, the bit line BL can be reliably connected by the contact VY even if the bit line BL is slightly deviated in the X direction due to the lithography.

Figure 3D:
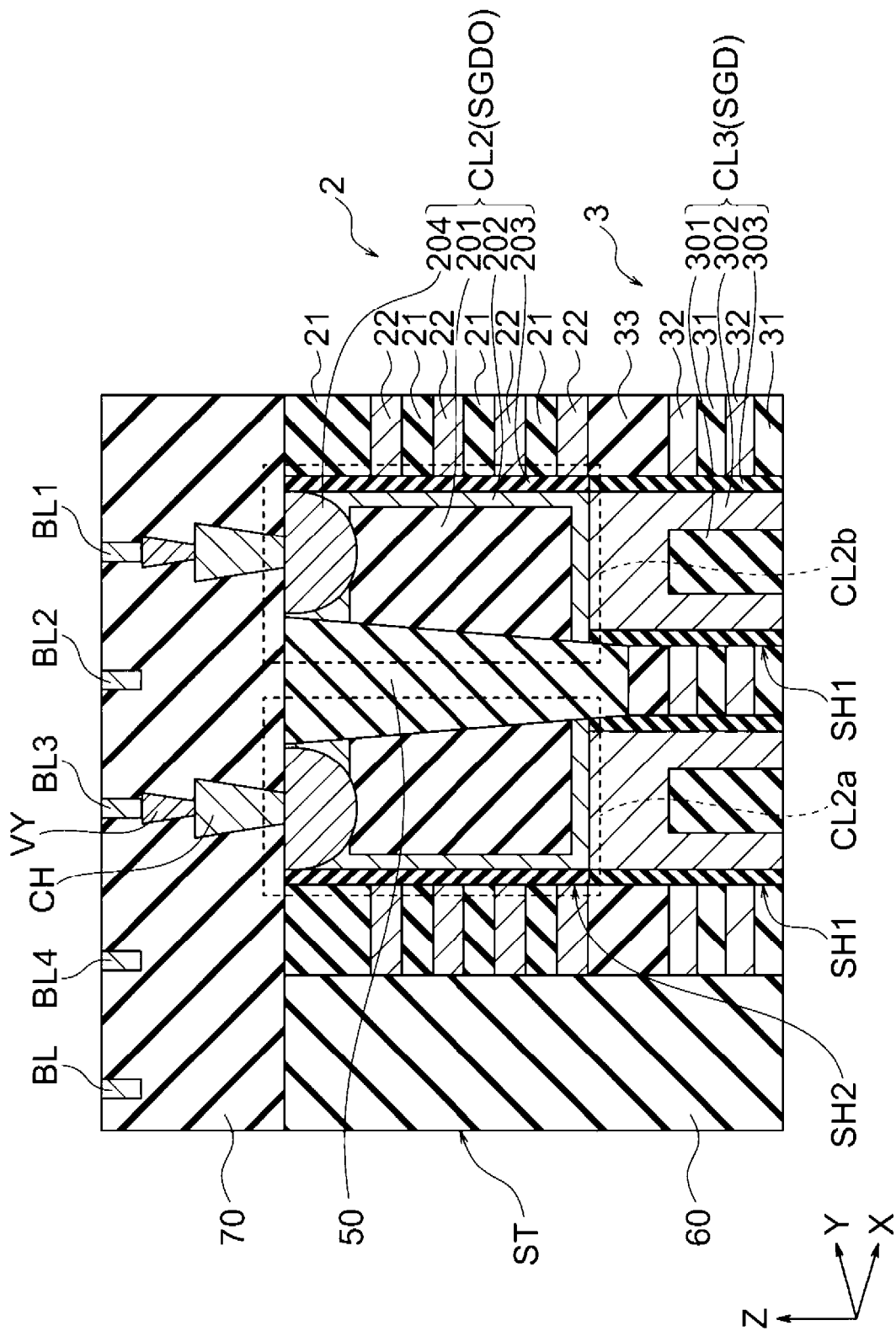
FIG. 3D is a schematic cross-sectional view taken along line B-B in FIG. 3B.

FIG. 3C is a schematic cross-sectional view taken along line A-A in FIG. 3B. FIG. 3D is a schematic cross-sectional view taken along line B-B in FIG. 3B. The second stacked body 2 includes a second insulating film 21 and a second conductive film 22 stacked in the Z direction. The columnar body CL2 is provided in a hole SH2 of the second stacked body 2, penetrates the second stacked body 2 from the upper end of the second stacked body 2 along the Z direction up to the upper surface of the third stacked body 3.

The columnar body CL2 includes a second insulator column 201, a semiconductor portion 202 provided on an outer periphery of the second insulator column 201, a first gate insulating film 203 provided on an outer periphery of the semiconductor portion 202, an impurity layer 204 provided on an upper portion of the semiconductor portion 202. For example, silicon oxide is used for the second insulator column 201. The semiconductor portion 202 functions as a channel region of the drain-side select gate SGDO. For example, undoped silicon is used for the semiconductor portion 202. A silicon oxide film may be used for the first gate insulating film 203, or a stacked film (ONO film) of a silicon oxide film, a silicon nitride film, and a silicon oxide film may be used. The impurity layer 204 may be, for example, an n-type impurity diffusion layer introduced into the semiconductor portion 202. The columnar body CL2 configures the drain-side select gate SGDO as the first select gate portion. The drain-side select gate SGDO electrically connects the columnar body CL3 and the bit line BL via the channel formed in the semiconductor portion 202 by using the second conductive film 22 as a gate electrode. In the second conductive film 22, the drain-side select gate SGDO selectively connects a specific memory cell string in the same block to the bit line BL by the first division insulating film 50.

The columnar body CL3 is provided in a hole SH1 below the columnar body CL2. The third stacked body 3 includes a third insulating film 31 and a third conductive film 32 stacked in the Z direction. The columnar body CL3 includes a third insulator column 301, a semiconductor portion 302 provided on the outer periphery of the third insulator column 301, and a second gate insulating film 303 provided on the outer periphery of the semiconductor portion 302. Silicon oxide is used for the third insulator column 301. The semiconductor portion 302 functions as a channel region of the drain-side select gate SGD. For example, silicon may be used for the semiconductor portion 302, and for example, undoped silicon may be used. For example, a silicon oxide film may be used for the second gate insulating film 303, or a stacked film (ONO film) of a silicon oxide film, a silicon nitride film, and a silicon oxide film may be used. The drain-side select gate SGD as the second select gate portion is controlled for each block BLOCK, and the drain-side select gate SGD in the same block BLOCK is controlled to be on or off simultaneously. Accordingly, it is possible to prevent the cell current in the selected block from leaking to another non-selected block (off-leakage).

The drain-side select gates SGDO and SGD are connected in series between the memory string and the bit line BL. When both the drain-side select gate SGDO and SGD are in the on state, the memory string is electrically connected to the bit line BL. Here, the drain-side select gate SGD connects the columnar body CL1 (memory string) to the drain-side select gate SGDO (columnar body CL2) in the selected block BLOCK. The drain-side select gate SGDO connects the columnar body CL1 (memory string) to the bit line BL in the selected division (finger).

The drain-side select gate SGDO is provided corresponding to the contact portion between the second conductive film 22 of the second stacked body 2 and the columnar body CL2. For example, the two columnar bodies CL2 illustrated in FIG. 3C are in contact with the second conductive film 22 on one side surface in the Y direction. On the other hand, on the other side surface in the Y direction, the first division insulating film 50 is buried between the columnar body CL2 and the second stacked body 2. Therefore, the columnar body CL2 is in contact with the first division insulating film 50 on the other side surface in the Y direction. That is, the drain-side select gate SGDO is provided on one side surface side of the columnar body CL2 in the Y direction and is configured with the columnar body CL2 and the second conductive film 22. A plurality of the drain-side select gates SGDO sharing the same second conductive film 22 are connected to different bit lines BL (refer to FIG. 3B). Accordingly, it is possible to prevent data from the plurality of memory cells MC from being read out from the same bit line BL at the same timing (to prevent contamination).

As illustrated in FIG. 3B, in a plan view seen from the Z direction, the first division insulating film 50 skewers the initial columnar body CL2i in the X direction and divides the initial columnar body CL2i. Although the first division insulating film 50 overlaps a portion (central portion) of the initial columnar body CL2i, the first division insulating film 50 does not overlap the whole. Therefore, the columnar bodies CL2 remain as channels of the drain-side select gate SGDO on both sides of the first division insulating film 50, and the drain-side select gate SGD can function normally. Accordingly, the columnar body CL1 below the drain-side select gate SGD can be normally selected by the drain-side select gate SGD as a memory string. As a result, the dummy memory cells are not increased.

When the drain-side select gate SGDO does not function due to the division insulating film, the memory cell of the columnar body CL1 located below the division insulating film cannot be used for storing data and becomes a dummy memory cell. This wastes the memory cell array and hinders the miniaturization of the memory cell array 2m.

On the other hand, according to at least one embodiment, although the first division insulating film 50 partially overlaps the initial columnar body CL2i, the columnar body CL2 can be effectively used as the drain-side select gate SGDO. Therefore, the first division insulating film 50 can increase the data capacity of the memory cell array 2m and miniaturize the memory cell array 2m without increasing the dummy memory cell.

FIG. 4 is an enlarged schematic plan view of a region 4 in FIG. 3B. FIG. 4 illustrates a case where FIG. 3D is seen in a plan view seen from the Z direction. FIG. 4 illustrates the pair of two adjacent columnar bodies CL2a and CL2b. The pair of columnar bodies CL2a and CL2b are integrated as the initial columnar body CL2i before the formation of the first division insulating film 50. Then, the first division insulating film 50 divides the initial columnar body CL2*i* into the pair of two columnar bodies CL2*a* and CL2*b* and electrically divides the second conductive film 22 corresponding to each of the columnar bodies CL2*a* and CL2*b*. As illustrated in FIG. 4, each of the pair of columnar bodies CL2*a* and CL2*b* is divided by the first division insulating film 50 and has a shape of both end portions such as a substantially oblate shape, a substantially elliptical shape, or a substantially rectangular shape. As illustrated by a virtual line 203VR, when both ends of an outer edge of a gate insulating film 203*a* of the columnar body CL2*a* are virtually stretched toward the columnar body CL2*b* via the first division insulating film 50, the virtual line 203VR is connected to both ends of an outer edge of a gate insulating film 203*b* of the columnar body CL2*b*. Here, the outer edge of the columnar body CL2*a*, the outer edge of the columnar body CL2*b*, and the virtual line 203VR configure the same substantially oblate, elliptical, or rectangular shape as that of the initial columnar body CL2*i*.

As described above, in the embodiment, the first division insulating film 50 divides the initial columnar body CL2*i* to configure a pair of columnar bodies CL2*a* and CL2*b*. In the columnar bodies CL2*a* and CL2*b*, a region other than the region facing the first division insulating film 50 faces the second conductive film 22 via the first gate insulating film 203 as a channel region of the drain-side select gate SGDO. Accordingly, the channel width of the drain-side select gate SGDO (the facing area between the columnar bodies CL2*a* and CL2*b* and the second conductive film 22) can be increased, and the drain-side select gate SGDO can allow a sufficient current from the selected memory cell MC to flow. The semiconductor portion 202 and the first gate insulating film 203 do not exist in the region other than the channel region facing the first division insulating film 50. Therefore, it is possible to prevent erroneous writing of data to the first gate insulating film 203, occurrence of off-leakage, and generation of electron traps.

Next, the wiring structure (bit line BL and contacts CH and VY) provided above the second stacked body 2 will be described in detail.

As illustrated in FIGS. 3A and 3B, the plurality of bit lines BL stretching in the Y direction are provided above the second stacked body 2. Specifically, the semiconductor storage device 100*a* includes the second conductive film 22 (SGD) and the plurality of bit lines BL stretching in a substantially orthogonal direction (Y direction) with respect to the stretching direction (X direction) of the first division insulating film 50 in a plan view seen from the stacking direction of the second stacked body 2.

As illustrated in FIGS. 3B to 3D, the contacts CH and VY and the bit line BL are provided above the columnar body CL2. That is, the semiconductor storage device 100*a* includes the contacts CH and VY electrically connected to the semiconductor portion 202 and the bit lines BL electrically connected to the contacts CH and VY, which are provided above the columnar body CL2. For example, a low resistance metal material such as titanium (Ti), titanium nitride (TiN), or tungsten (W) is used for the contact CH. For example, a low resistance metal material such as titanium nitride or tungsten is used for the contact VY. For example, a low resistance metal material such as tungsten or copper is used for the bit line BL.

As illustrated in FIG. 3B, the columnar body CL2*a* and a columnar body CL2*aa* are in common contact with the second conductive film 22 as a drain-side select gate SGDO. On the other hand, the columnar body CL2*a* is connected to a bit line BL3, but the columnar body CL2*aa* is connected to another bit line BL. That is, the two drain-side select gates SGDO corresponding to the columnar bodies CL2*a* and CL2*aa* sharing the drain-side select gate SGDO are connected to different bit lines BL, respectively. Therefore, it is possible to prevent data contamination in the bit line BL.

As described above, according to the embodiment, the first division insulating film 50 skewers the initial columnar body CL2*i* in the X direction, and the initial columnar body CL2*i* is divided into the pair of two columnar bodies CL2*a* and CL2*b*. The first division insulating film 50 electrically insulates the adjacent columnar bodies CL2*a* and CL2*b*. Although the first division insulating film 50 overlaps a portion of the central portion of the initial columnar body CL2*i*, the first division insulating film 50 does not overlap the columnar bodies CL2*a* and CL2*b* on both sides thereof. Therefore, the columnar bodies CL2*a* and CL2*b* function as the two different drain-side select gates SGDO. Therefore, the columnar body CL1 below the columnar bodies CL2*a* and CL2*b* can function as a memory string and does not increase the dummy memory cell. Accordingly, the cell region in the block BLOCK can be effectively used, which leads to miniaturization of the memory cell array 2*m*.

According to at least one embodiment, the pair of columnar bodies CL2*a* and CL2*b* does not have the semiconductor portion 202 and the first gate insulating film 203 at the portion which is in contact with the first division insulating film 50. On the other hand, the columnar bodies CL2*a* and CL2*b* have a semiconductor portion 202 in other regions and face the second conductive film 22 via a first gate insulating film 20. Therefore, while widening the channel width of the drain-side select gate SGDO, it is possible to prevent erroneous writing of data to the first gate insulating film 203, the occurrence of off-leakage, and the generation of electron traps.

Next, a method for manufacturing the semiconductor storage device 100*a* according to at least one embodiment will be described. FIGS. 5A to 12 are plan views or cross-sectional views illustrating an example of the method for manufacturing the semiconductor storage device 100*a* according to the first embodiment.

First, a first stacked body 1*a* in which the first insulating film 11 and a first sacrificial film 12*b* are alternately stacked is formed on the base portion 4 including the substrate 40. For example, silicon oxide (SiO2) is used for the first insulating film 11, and for example, silicon nitride (SiN) is used for the first sacrificial film 12*b*. Next, a plurality of the memory holes MH of the first stacked body 1*a* are formed in the first stacked body 1*a* from above the first stacked body 1*a* by using a lithography technique, an etching technique, or the like. Next, in the memory hole MH, the first insulator column 101, the semiconductor portion 102 provided on the outer periphery of the first insulator column 101, and the charge trapping film 103 provided on the outer periphery of the semiconductor portion 102 are formed, and the columnar body CL1 is formed.

Next, as illustrated in FIGS. 5A and 5B, a third insulating film 31 and a third sacrificial film 32*a* are alternately stacked on the first stacked body 1, and an interlayer insulating film 33 is further stacked to form a third stacked body 3*a*. FIG. 5B corresponds to a cross section taken along line C-C of FIG. 5A. For example, silicon oxide is used for the third insulating film 31, and for example, silicon nitride is used for the third sacrificial film 32*a*. For example, silicon oxide or silicon carbon nitride (SiCN) is used for the interlayer insulating film 33. The interlayer insulating film 33 functions as an etching stopper layer in the formation of the hole SH2 of the second stacked body 2, which is a process described later.

Next, a plurality of holes SH1 are formed in the third stacked body 3a. Next, as illustrated in FIG. 5B, the second gate insulating film 303 is formed on the inner wall of the hole SH1, the semiconductor portion 302 is formed inside the second gate insulating film 303, and the third insulator column 301 is filled inside the semiconductor portion 302. For example, a silicon oxide film or an ONO film is used for the second gate insulating film 303. For example, silicon is used for the semiconductor portion 302. For example, a silicon oxide film is used for the third insulator column 301.

Next, the upper portion of the third insulator column 301 is etched back to bury the material of the semiconductor portion 302 thereon. Accordingly, the columnar body CL3 illustrated in FIG. 5B is formed in the hole SH1. When the third stacked body 3a and the columnar body CL3 are omitted, the processes illustrated in FIGS. 5A and 5B are also omitted.

Next, as illustrated in FIG. 6, the second insulating film 21 and a second sacrificial film 22a are alternately stacked on the third stacked body 3a to form a second stacked body 2a. For example, silicon oxide is used for the second insulating film 21, and for example, silicon nitride is used for the second sacrificial film 22a. FIG. 6 corresponds to a cross section taken along line C-C of FIG. 5A.

Next, as illustrated in FIGS. 7A and 7B, the hole SH2 is formed in the second stacked body 2a from above the second stacked body 2a by using a lithography technique, an etching technique, or the like. FIG. 7B corresponds to a cross section taken along line D-D of FIG. 7A. Here, the hole SH2 is formed up to the interlayer insulating film 33 which is the etching stopper of the third stacked body 3a. In the region where the columnar body CL3 is provided, the hole SH2 is formed up to the semiconductor portion 302. As illustrated in FIG. 7A, the hole SH2 is formed in a substantially oblate shape, a substantially elliptical shape, or a substantially rectangular shape having a major axis or a minor axis in a direction inclined with respect to the X and Y directions in a plan view seen from the Z direction.

Next, the first gate insulating film 203 is formed on the inner wall of the hole SH2, the semiconductor portion 202 is formed inside the first gate insulating film 203 to cover the first gate insulating film 203, and the second insulator column 201 is buried inside the semiconductor portion 202. For example, silicon is used for the semiconductor portion 202. The silicon may be, for example, polysilicon obtained by crystallizing amorphous silicon. The silicon may be, for example, undoped silicon and may be, for example, p-type silicon. The first gate insulating film 203 may be a silicon oxide film, or may be a stacked film (ONO film) of a silicon oxide film, a silicon nitride film, and a silicon oxide film. Accordingly, the columnar bodies CL2 are formed on the two adjacent columnar bodies CL3 (and the two adjacent columnar bodies CL1) to correspond to the two adjacent columnar bodies CL3 (and the two adjacent columnar bodies CL1). That is, the hole SH2 bridges the two columnar bodies CL3 that are adjacent to each other in an inclined direction with respect to the X or Y direction.

Next, as illustrated in FIGS. 8A and 8B, the slit ST penetrating the first stacked body 1a, the second stacked body 2a, and the third stacked body 3a is formed by using a lithography technique, a reactive ion etching (RIE) method, or the like. FIG. 8B corresponds to across section taken along line E-E of FIG. 8A. The first sacrificial film 12b of the first stacked body 1a, the second sacrificial film 22a of the second stacked body 2a, and the third sacrificial film 32a of the third stacked body 3a are removed with a phosphoric acid solution or the like via the slit ST. Then, a first space, a second space, and third space are formed between the first insulating films 11, between the second insulating films 21, and between the third insulating films 31, respectively. Tungsten (W) is further buried in the first to third spaces by using titanium nitride (TiN), which is a conductive metal, as a barrier metal. The conductive metal buried between the first insulating films 11 functions as the first conductive film 12. The conductive metal buried between the second insulating films 21 functions as the second conductive film 22, and the conductive metal buried between the third insulating films 31 functions as the third conductive film 32. By doing so, a process of burying the first conductive film 12, the second conductive film 22, and the third conductive film 32 in the space from which the first sacrificial film 12b, the second sacrificial film 22a, and the third sacrificial film 32a are removed is called a replacing process.

The surfaces of the second conductive film 22 and the third conductive film 32 may be covered with a cover insulating film (not illustrated) in order to prevent the diffusion of the second conductive film 22 and the third conductive film 32. For example, silicon oxide is used for the cover insulating film.

After the above replacing process, the slit ST is filled with an insulating film such as silicon oxide to form the division insulating film 60. Accordingly, the block BLOCK interposed between the division insulating films 60 is partitioned. An insulating film made of silicon oxide or the like may be formed on the slit ST, and a conductive material may be buried inside the slit ST. Accordingly, the slit ST may be used as wiring while functioning as the division insulating film 60.

Figure 9A:
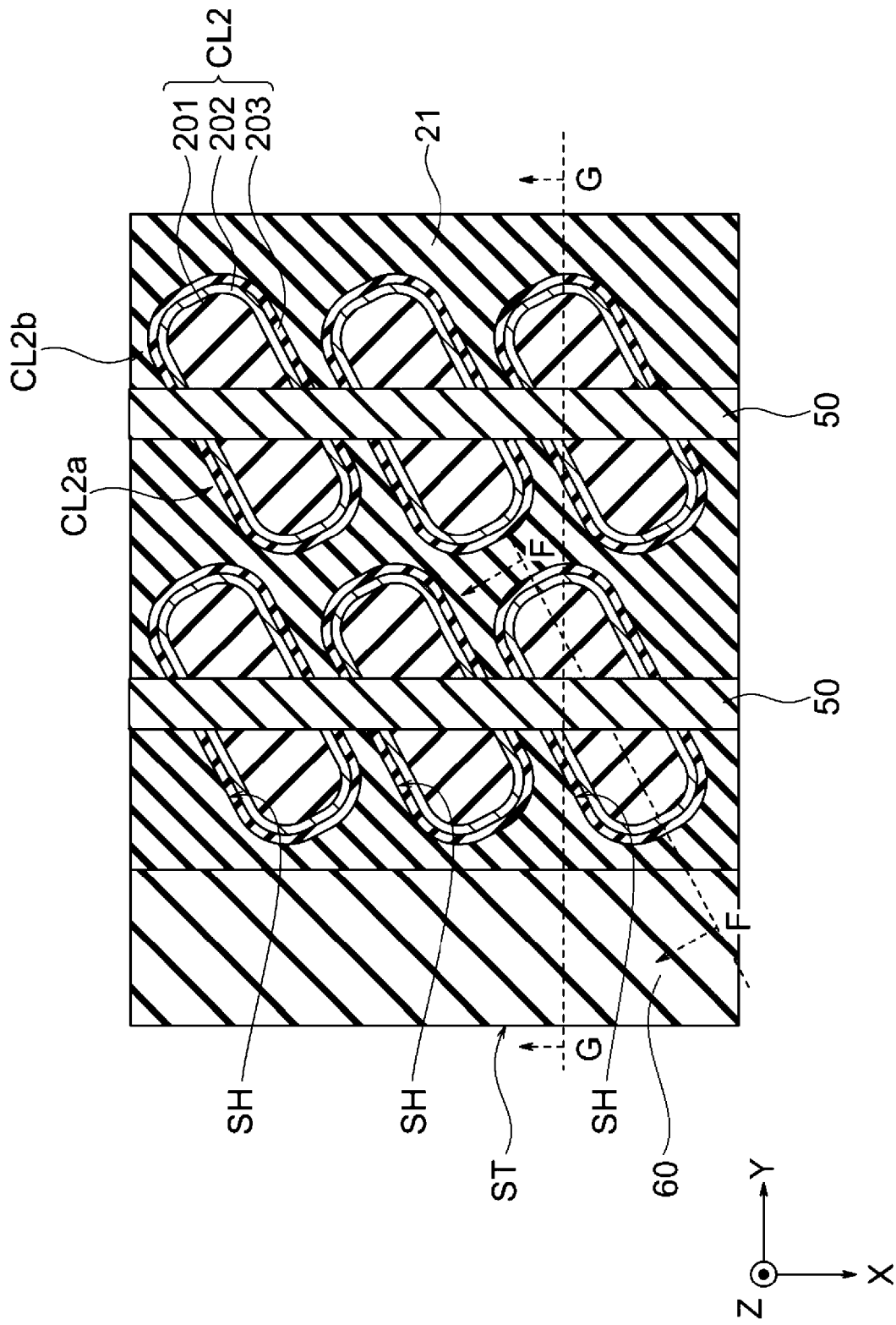
FIG. 9A is a schematic plan view illustrating the method for manufacturing the semiconductor storage device following FIG. 8A.
Figure 9B:
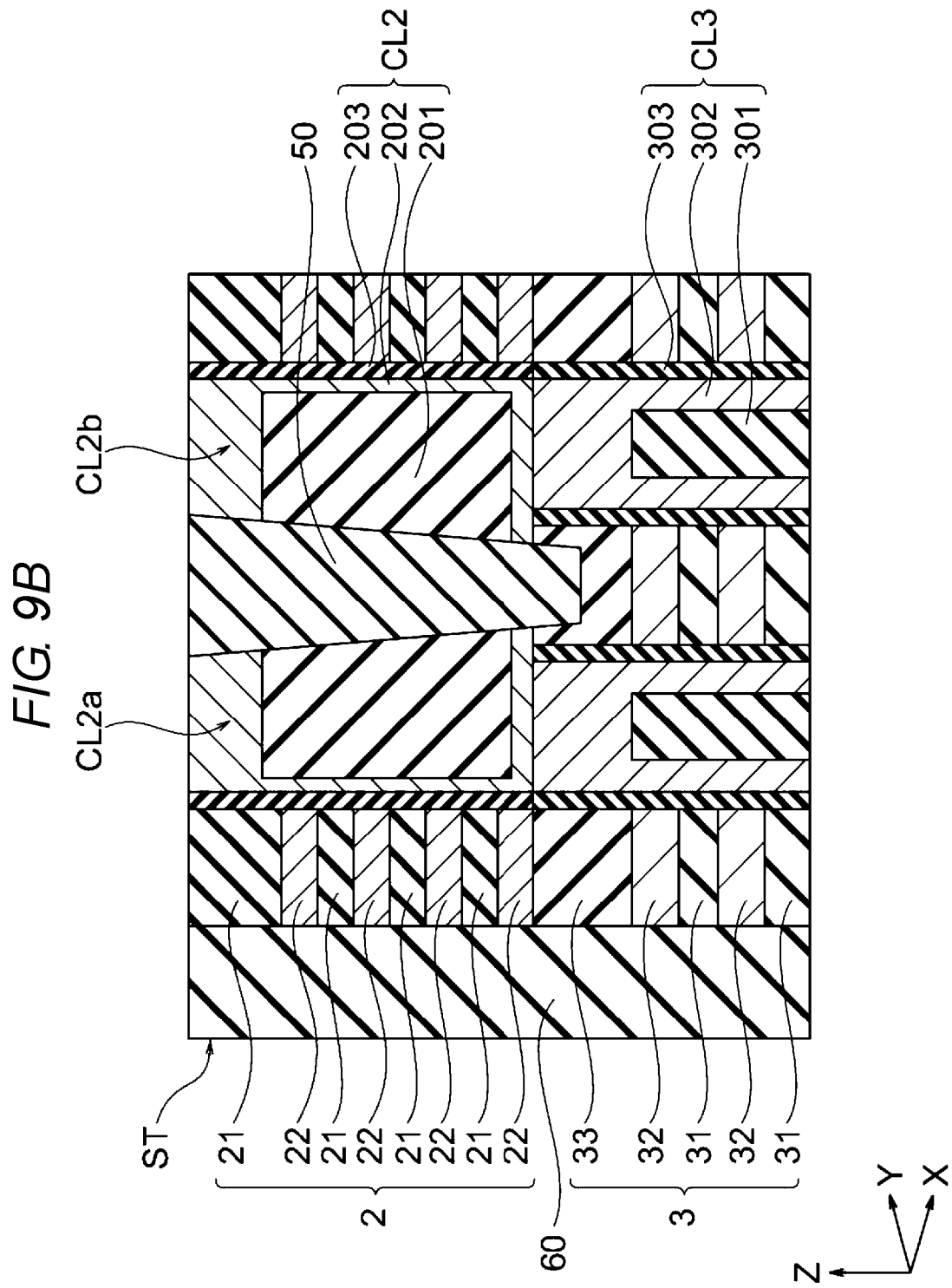
FIG. 9B is a schematic cross-sectional view taken along line F-F of FIG. 9A.

Next, as illustrated in FIGS. 9A to 9C, the columnar body CL2 and the second stacked body 2 are etched to divide the initial columnar body CL2i at the substantially center thereof in the X direction by using a lithography technique and an etching technique. An insulating film is buried in the slit to form the first division insulating film 50. Accordingly, the first division insulating film 50 is formed to divide the initial columnar body CL2i at the substantially center thereof in the X direction. That is, as illustrated in FIG. 9A, in a planar shape of the hole SH2, the initial columnar body CL2i is divided so that the first division insulating film 50 passes the substantially center of the initial columnar body CL2i. It is preferable that the left and right areas of the columnar body CL2i after the division are substantially equal. For example, silicon oxide is used for the first division insulating film 50. It is noted that FIG. 9B illustrates a cross section along the F-F line of FIG. 9A, and FIG. 9C illustrates a cross section along the G-G line of FIG. 9A.

Therefore, the initial columnar body CL2i is divided into two columnar bodies CL2a and CL2b with the first division insulating film 50 interposed therebetween. Accordingly, a pair of the columnar bodies CL2a and CL2b is formed. The pair of columnar bodies CL2a and CL2b has the shape of both end portions of a substantially oblate or substantially ellipse divided by the first division insulating film 50 in a plan view seen from the Z direction.

Figure 10:
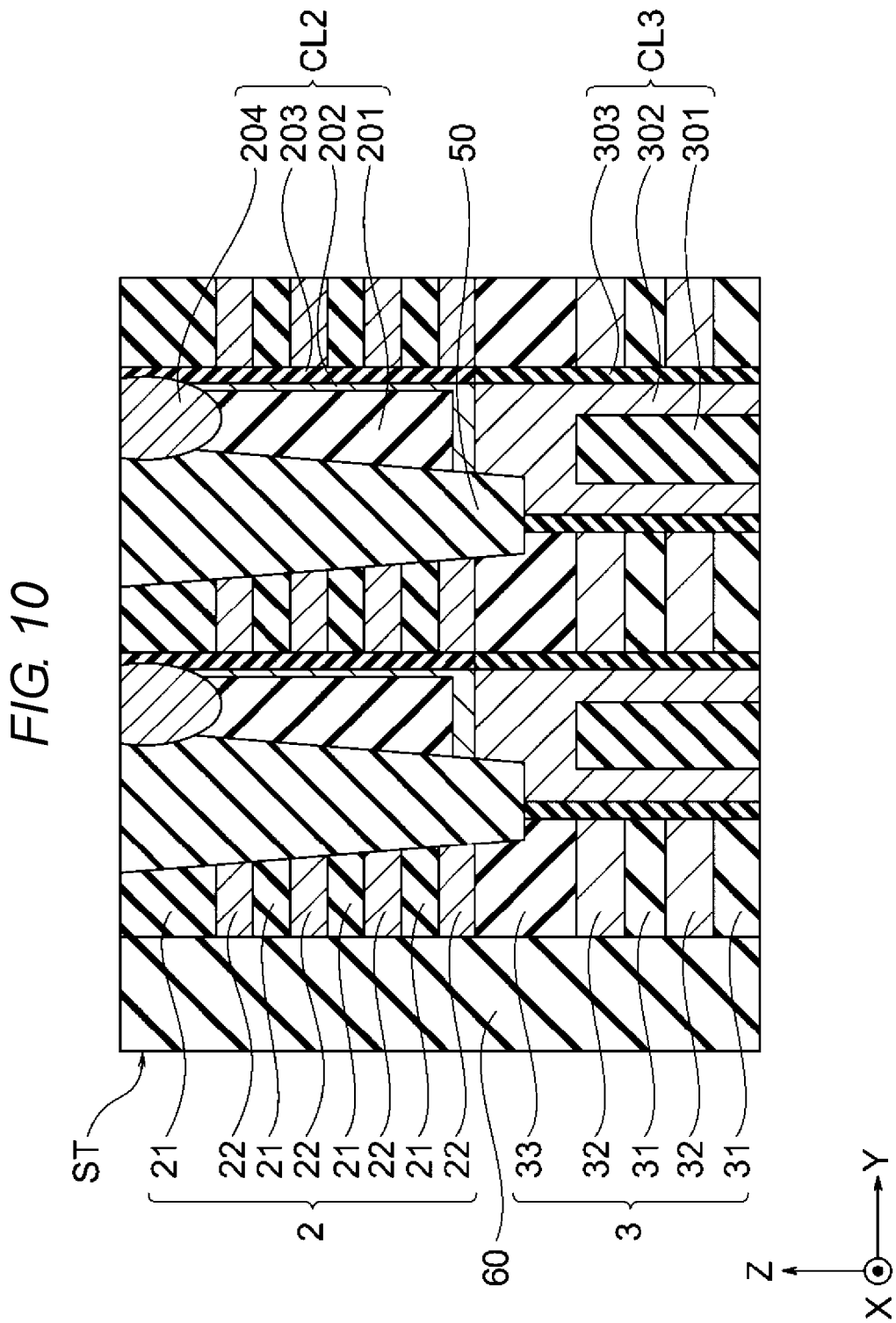
FIG. 10 is a schematic cross-sectional view illustrating the method for manufacturing the semiconductor storage device following FIG. 9A.

Next, as illustrated in FIG. 10, an n-type impurity is introduced into the semiconductor portion 202 by using a lithography technique and a doping technique to form an n-type impurity layer 204 on the upper portion of the semiconductor portion 202. The impurity layer 204 is formed to reach the columnar body CL2 and is electrically connected to the semiconductor portion 202.

Figure 11:
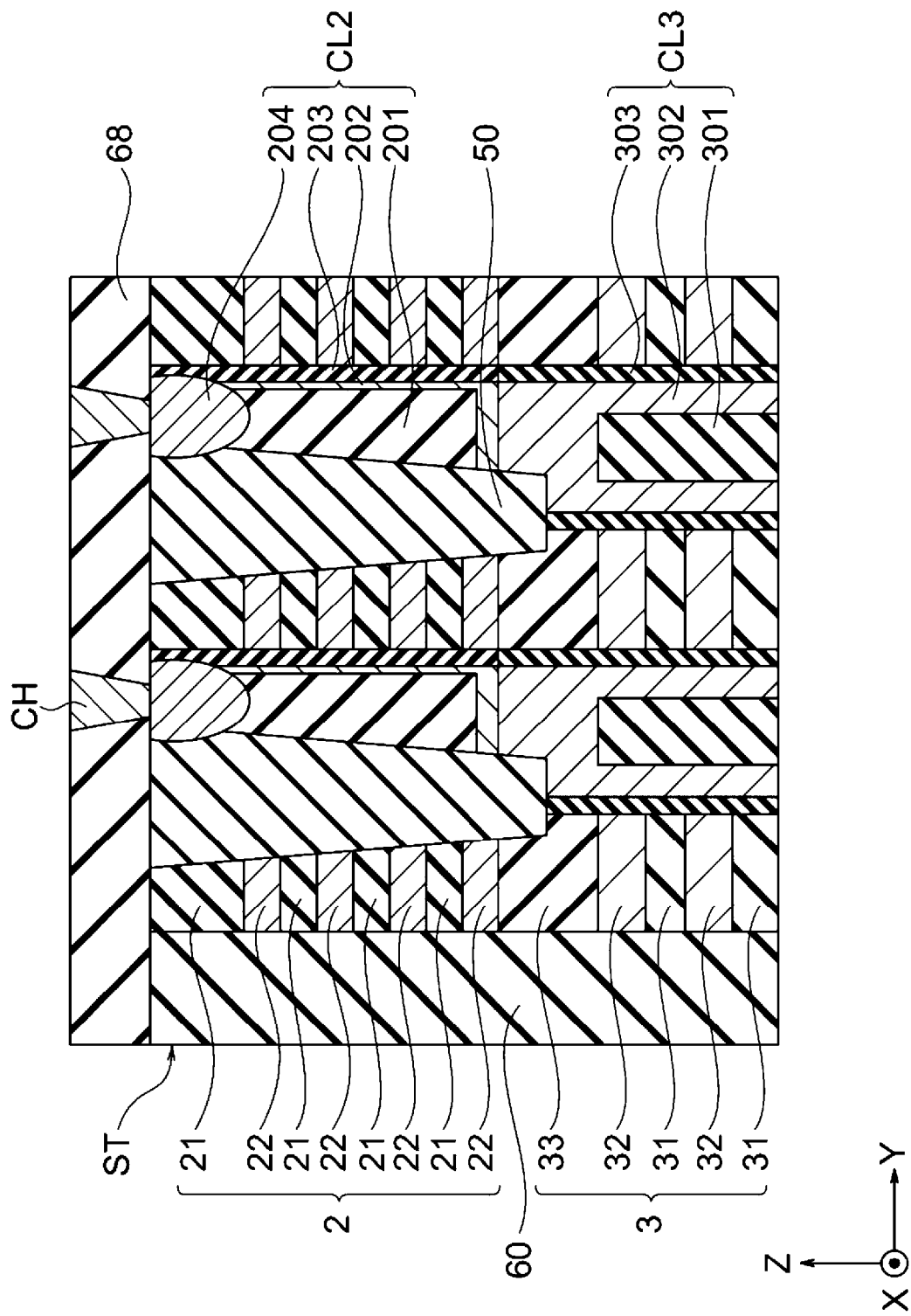
FIG. 11 is a schematic cross-sectional view illustrating the method for manufacturing the semiconductor storage device following FIG. 10.

Next, as illustrated in FIG. 11, an interlayer insulating film 68 is formed on the upper surface of the second stacked body 2. For example, silicon oxide is used for the interlayer insulating film 68. Next, the interlayer insulating film 68 on the impurity layer 204 is processed by using a lithography technique and an etching technique to form a contact hole at the position of the contact CH. The contact hole may be formed to a depth reaching the upper surface of the impurity layer 204 and may be formed in a substantially oblate shape or a substantially elliptical shape in a plan view seen from the Z direction. Next, the contact hole is filled with titanium (Ti), titanium nitride (TiN) or tungsten (W), and polishing by a chemical mechanical polishing (CMP) method is performed. Accordingly, as illustrated in FIG. 11, the contact CH is formed.

Figure 12:
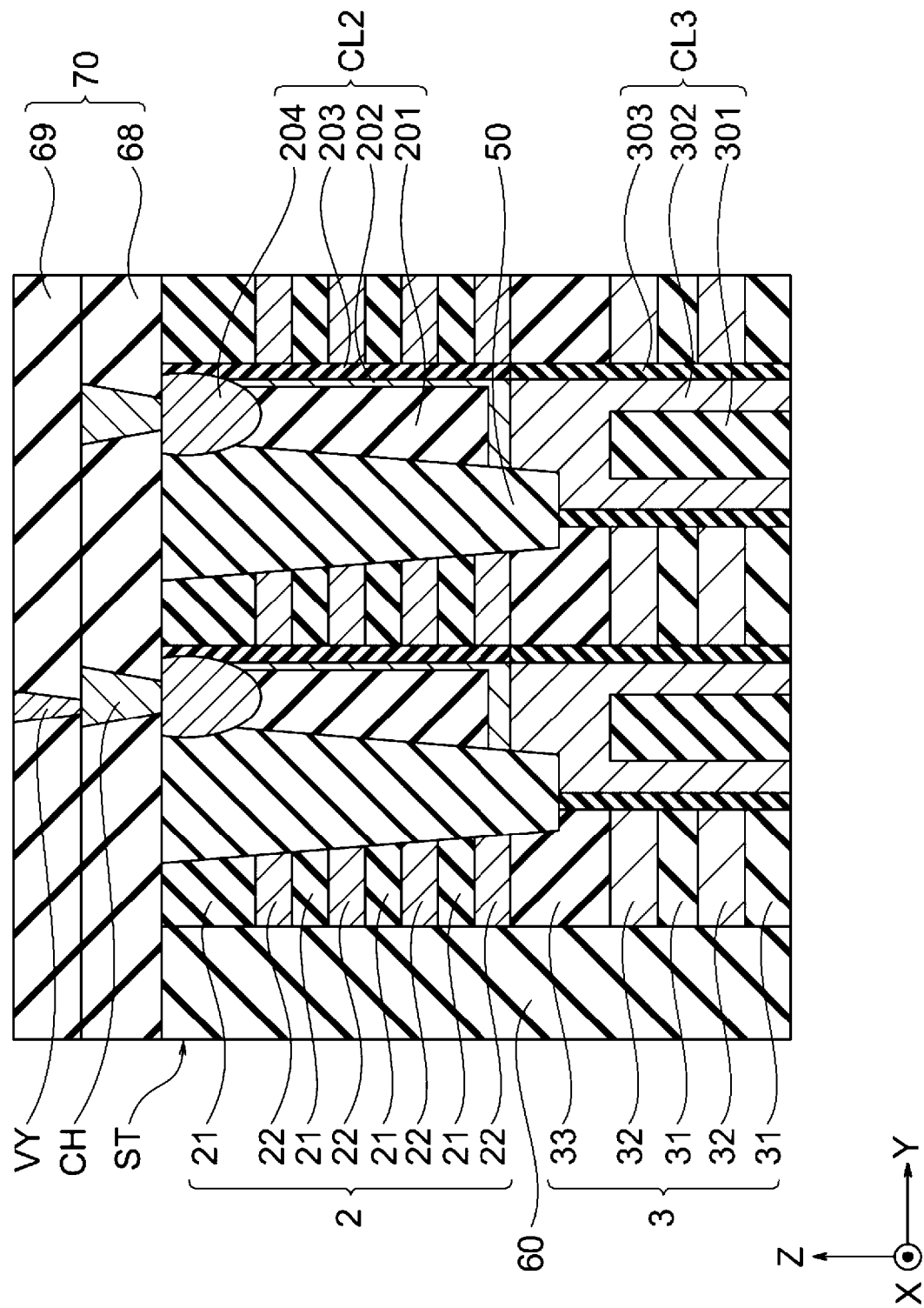
FIG. 12 is a schematic cross-sectional view illustrating the method for manufacturing the semiconductor storage device following FIG. 11.

Next, as illustrated in FIG. 12, an interlayer insulating film 69 is formed on the upper surface of the interlayer insulating film 68. For example, silicon oxide is used for the interlayer insulating film 69. The interlayer insulating film 68 and the interlayer insulating film 69 form an interlayer insulating film 70. Next, a contact hole is formed in the interlayer insulating film 69 on the contact CH by using a lithography technique and an etching technique. The contact hole may be formed to a depth reaching the upper surface of the contact CH and may be formed in a substantially circular shape or a substantially elliptical shape in a plan view seen from the Z direction. Next, the contact hole is filled with titanium nitride or tungsten, and polishing by the CMP method is performed. Accordingly, as illustrated in FIG. 12, the contact VY is formed.

Next, as illustrated in FIG. 3C, a plurality of bit lines BL are provided above the contact VY to be electrically connected to the contact VY. Accordingly, the bit line BL and the columnar body CL2 are electrically connected via the contacts CH and VY. The bit line BL stretches in a direction (Y direction) substantially orthogonal to the stretching direction of the second conductive film 22 and the first division insulating film 50 in a plan view seen from the Z direction. By the above-mentioned processes, the semiconductor storage device 100a illustrated in FIGS. 3C to 3D is obtained.

As described above, according to the embodiment, the first division insulating film 50 is formed to skewer the initial columnar body CL2i in the X direction in a plan view seen from the Z direction and is divided into a pair of the two columnar bodies CL2a and CL2b. Although the first division insulating film 50 overlaps a portion of the central portion of the initial columnar body CL2i, the first division insulating film 50 does not overlap the columnar bodies CL2a and CL2b on both sides thereof. The columnar bodies CL2a and CL2b can function as two different drain-side select gates SGDO, and the columnar body CL1 below the columnar bodies CL2a and CL2b can function as a memory string. Accordingly, the first division insulating film 50 does not increase the number of dummy memory cells and enables the cell region in the block BLOCK to be effectively used. As a result, waste of the memory cell array can be reduced, and the memory cell array 2m can be further miniaturized.

According to the embodiment, in the columnar bodies CL2a and CL2b, the region other than the region facing the first division insulating film 50 faces the second conductive film 22 via the first gate insulating film 203 as the channel region of the drain-side select gate SGDO. Accordingly, the channel width of the drain-side select gate SGDO can be increased, and the drain-side select gate SGDO can allow a sufficient current from the selected memory cell MC to flow.

The semiconductor portion 202 and the first gate insulating film 203 do not exist in the region facing the first division insulating film 50 other than the channel region. Therefore, it is possible to prevent erroneous writing of data to the first gate insulating film 203, the occurrence of off-leakage, and the generation of electron traps. Therefore, the controllability of the drain-side select gate SGDO is improved.

Second Embodiment

Figure 13A:
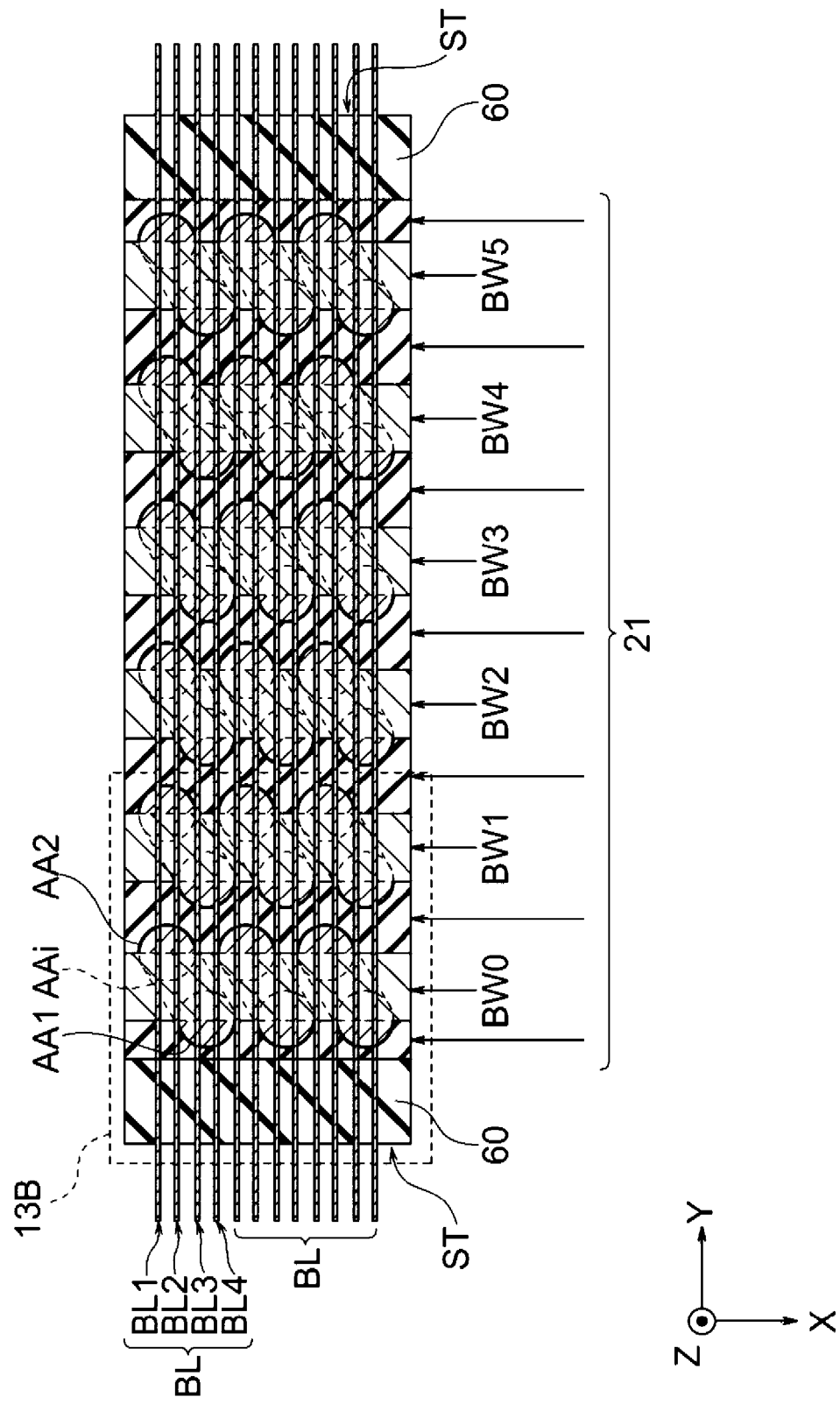
FIG. 13A is a schematic plan view of a second insulating film according to a second embodiment as seen from a Z direction.
Figure 13B:
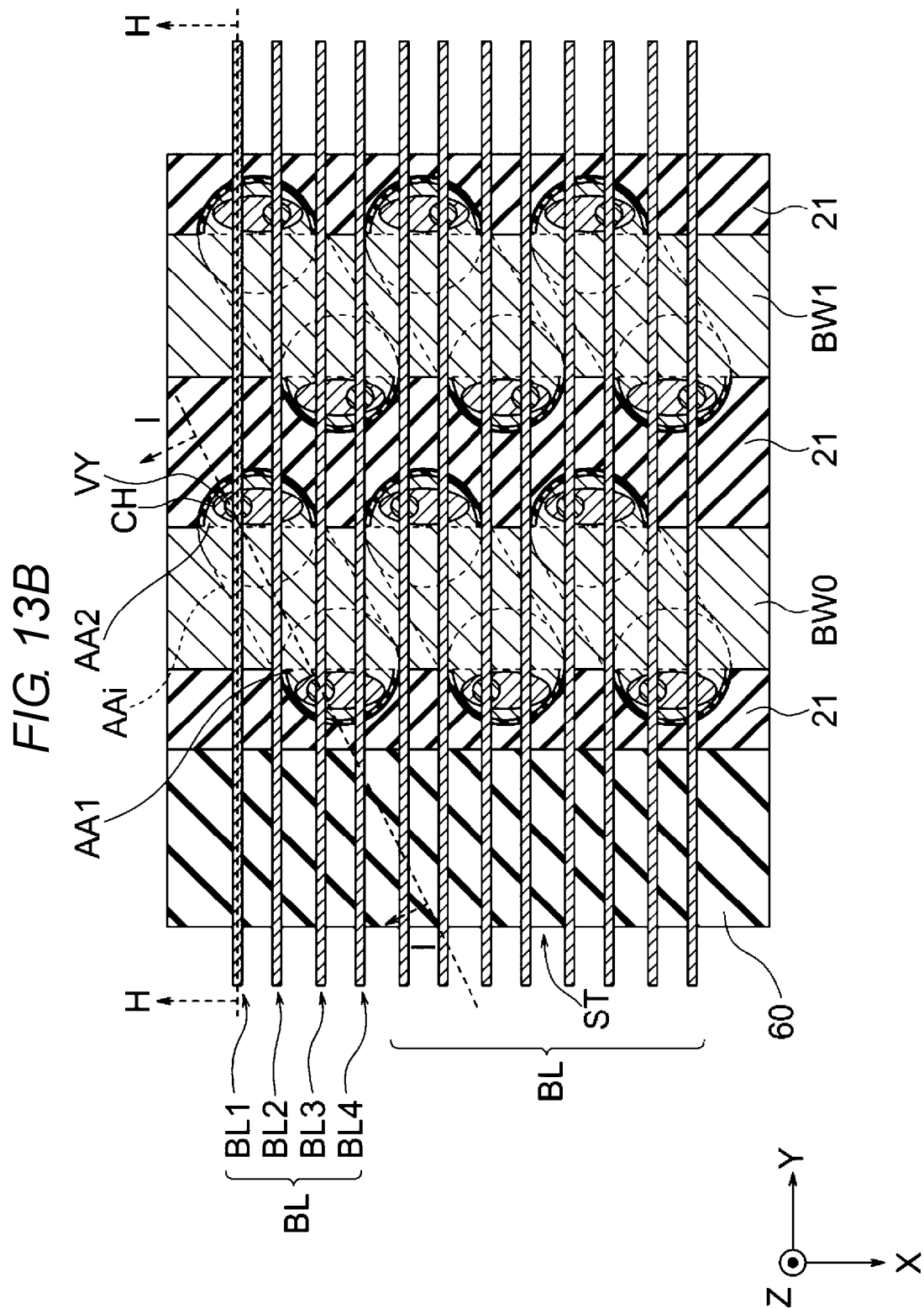
FIG. 13B is a schematic plan view of a region 13B in FIG. 13A.

FIG. 13A is a schematic plan view of the second stacked body according to the second embodiment as seen from the Z direction. FIG. 13B is a schematic plan view of the region 13B in FIG. 13A.

The second embodiment is similar to the first embodiment in that a conductive layer BW and the second insulating film 21 are alternately arranged in a striped shape in a plan view seen from the Z direction. However, in the second embodiment, the conductive layer BW skewers the active area in the X direction, and an initial first semiconductor column AAi is divided into two. Accordingly, the initial first semiconductor column AAi is divided into two first semiconductor columns AA1 and AA2. That is, in the middle of the manufacturing process, the initial first semiconductor column AAi has a substantially oblate shape, a substantially elliptical shape, or a substantially rectangular shape and is divided into two by the formation of the conductive layer BW to form a pair of the first semiconductor columns AA1 and AA2. For example, a conductive metal such as tungsten (W) is used for the conductive layer BW. On the other hand, the second insulating film 21 is provided between the adjacent conductive layers BW and is provided between the two first semiconductor columns AA that are adjacent to each other in an inclined direction with respect to the X or Y direction. For example, an insulating material such as silicon oxide is used for the second insulating film 21. As described above, in the second embodiment, the conductive layer BW (drain-side select gate SGD) is provided between the paired first semiconductor columns AA1 and AA2. Other configurations of the planar layout of the second embodiment may be the same as the corresponding configuration of the planar layout of the first embodiment.

Figure 13D:
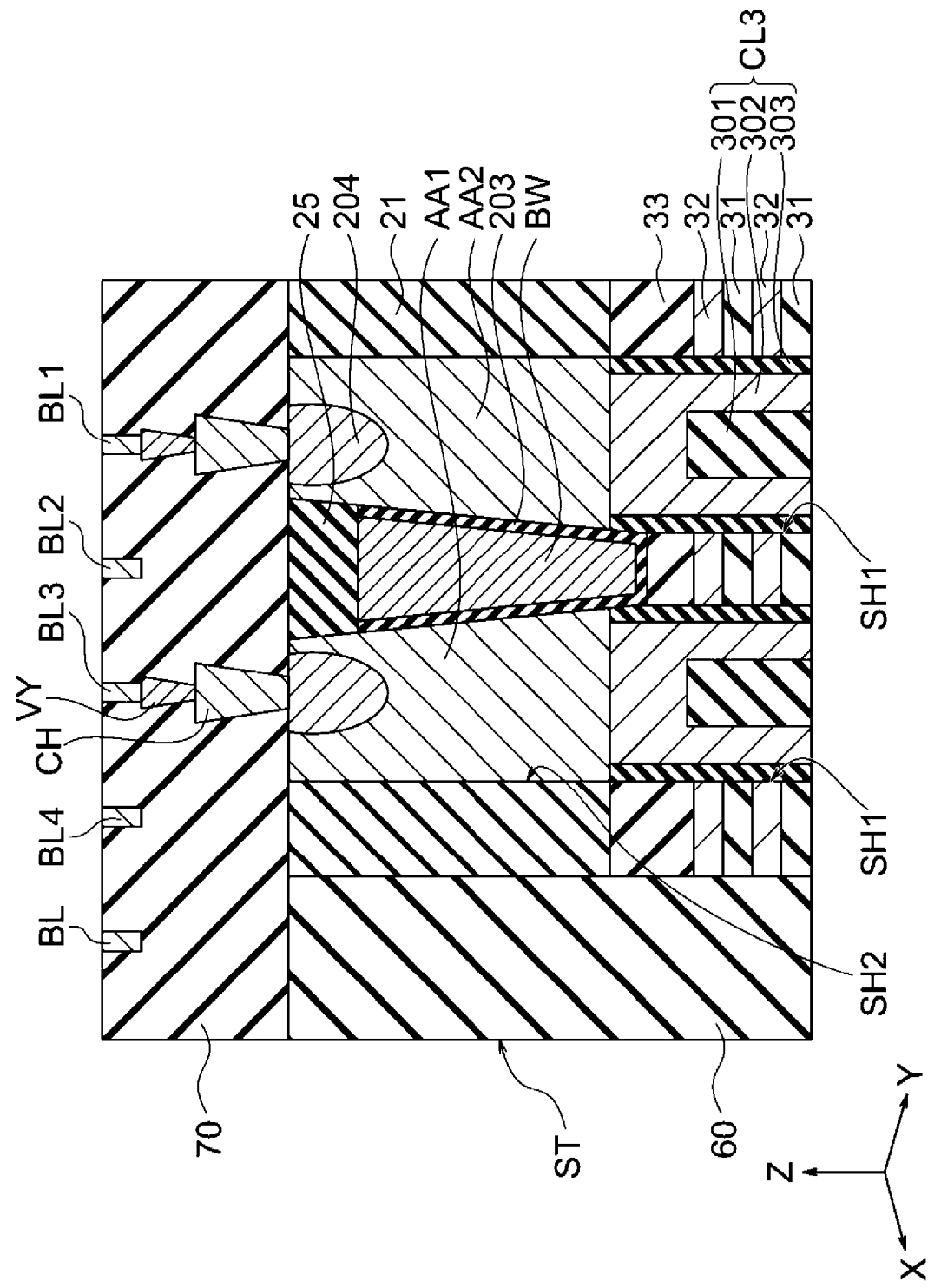
FIG. 13D is a schematic plan view along line I-I of FIG. 13B.

FIG. 13C is a schematic cross-sectional view taken along line H-H of FIG. 3B. FIG. 13D is a schematic plan view taken along line I-I of FIG. 13B. In the second embodiment, the second conductive film 22 is not provided, and the second insulating film 21 is provided instead of the second stacked body. As the gate electrode of the drain-side select gate SGDO, the conductive layer BW is provided instead of the second conductive film 22. The conductive layer BW faces the first semiconductor columns AA1 and AA2 via the gate insulating film 203 and functions as a gate electrode of the drain-side select gate SGD. For example, a silicon oxide film or an ONO film is used for the gate insulating film 203.

The pair of first semiconductor columns AA1 and AA2 is provided in the hole SH2 provided in the second insulating film 21 and penetrates the second insulating film 21 from the upper end of the second insulating film 21 along the Z direction up to the upper surface of the columnar body CL3. The first semiconductor columns AA1 and AA2 function as channel regions of the drain-side select gate SGDO.

In the second embodiment, the drain-side select gate SGDO is configured with the conductive layer BW and the first semiconductor column AA1 (or AA2). For example, the two first semiconductor columns AA1 and AA2 in FIG. 13C face the conductive layer BW via the gate insulating film 203 on one side surface in the Y direction. The conductive layer BW is buried between the first semiconductor columns AA1 and AA2 and the second insulating film 21. On the other hand, the second insulating film 21 is in contact with the first semiconductor columns AA1 and AA2 on the other side surface of the first semiconductor columns AA1 and AA2 in the Y direction. Therefore, the drain-side select gate SGDO is provided on one side surface side of the first semiconductor columns AA1 and AA2 in the Y direction, respectively. The drain-side select gate SGDO is provided in a facing region of the first semiconductor columns AA1 and AA2 and the conductive layer BW.

In the second embodiment, the conductive layer BW skewers the initial first semiconductor column AAi in the X direction, and the initial first semiconductor column AAi is divided into a pair of the first semiconductor columns AA1 and AA2. Therefore, the conductive layer BW overlaps the central portion of the initial first semiconductor column AAi, but the conductive layer BW does not overlap as a whole. Therefore, as illustrated in FIG. 13D, the first semiconductor columns AA1 and AA2 remain as channels of the drain-side select gate SGD on both sides of the conductive layer BW. The conductive layer BW does not almost reach the two columnar bodies CL3 and the two columnar bodies CL1 directly under the first semiconductor columns AA1 and AA2. Therefore, the first semiconductor columns AA1 and AA2 can function as a portion of two different drain-side select gates SGDO. The columnar body CL1 below each of the first semiconductor columns AA1 and AA2 effectively functions as a memory string. Accordingly, the conductive layer BW does not increase the number of dummy memory cells and enables the cell region in the block BLOCK to be effectively used.

Other configurations of the second embodiment may be the same as the corresponding configurations of the first embodiment. Therefore, according to the second embodiment, it is also possible to obtain effects other than those of the first embodiment.

Next, a method for manufacturing a semiconductor storage device 100b according to the second embodiment will be described.

FIGS. 14 to 17 are schematic cross-sectional views or schematic plan views illustrating an example of the method for manufacturing the semiconductor storage device 100b according to the second embodiment.

First, similarly to the first embodiment, the first stacked body 1a, the columnar body CL1, the stacked body 3a, and the columnar body CL3 are formed.

Next, as illustrated in FIG. 14, the second insulating film 21 is formed above the stacked body 3a. The thickness of the second insulating film 21 in the Z direction may be, for example, about the same thickness as the second stacked body 2 of the first embodiment.

Next, as illustrated in FIGS. 15A and 15B, the hole SH2 is formed in the second insulating film 21 by using a lithography technique, an etching technique, or the like. FIG. 15B corresponds to the cross section taken along line J-J of FIG. 15A. The hole SH is formed up to the interlayer insulating film 33 which is the etching stopper layer of the stacked body 3a. In the region where the columnar body CL3 is provided, the hole SH2 is formed up to the semiconductor portion 302. After the hole SH2 is formed, the initial first semiconductor column AAi is formed in the hole SH2. As illustrated in FIG. 15A, the initial first semiconductor column AAi is formed in a substantially oblate shape, a substantially elliptical shape, or a substantially rectangular shape having a major axis or a minor axis in a direction inclined with respect to the X and Y directions in a plan view seen from the Z direction.

Next, as described with reference to FIGS. 9A and 9B, the slit ST is formed, and the replacing process is executed. Here, the first sacrificial film 12b of the first stacked body 1a is replaced with the first conductive film 12, and the sacrificial film 32a of the stacked body 3a is replaced with the conductive film 32. In the second embodiment, since the second stacked body 2 is not provided, the replacing process is not performed in the second insulating film 21. In the second embodiment, the replacing process may be performed before the formation of the insulating film 21.

Figure 16C:
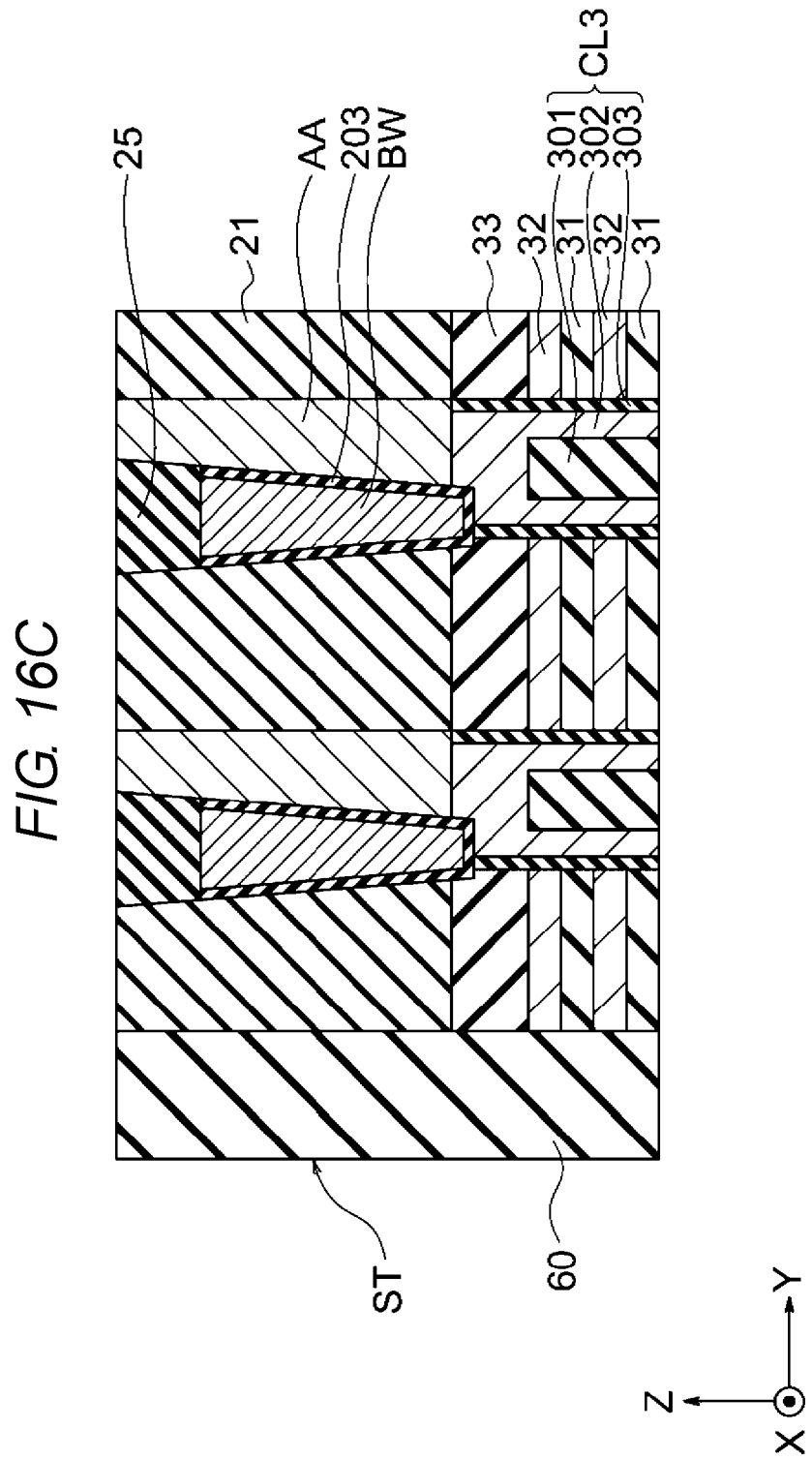
FIG. 16C is a schematic cross-sectional view taken along line L-L of FIG. 16A.

Next, as illustrated in FIGS. 16A to 16C, the initial first semiconductor column AAi and the second insulating film 21 are etched to form the slit to divide the initial first semiconductor column AAi at the substantially center thereof in the X direction by using a lithography technique and an etching technique. FIG. 16B illustrates a cross section taken along line K-K in FIG. 16A, and FIG. 16C illustrates a cross section taken along line L-L in FIG. 16A. The gate insulating film 203 is formed on the inner wall of the slit, and a material for the conductive layer BW is further buried inside the gate insulating film 203. Accordingly, the conductive layer BW is formed to divide the initial first semiconductor column AAi at the substantially center thereof in the X direction. The conductive layer BW is electrically insulated from the first semiconductor columns AA1 and AA2 by the gate insulating film 203. Therefore, as illustrated in FIG. 16A, in the planar shape of the hole SH2, the initial first semiconductor column AAi is divided so that the conductive layer BW passes the substantially center of the initial first semiconductor column AAi. It is noted that it is preferable that the left and right areas of the initial first semiconductor column AAi after the division are substantially equal.

Therefore, the initial first semiconductor column AAi is divided into the two first semiconductor columns AA1 and AA2 with the conductive layer BW interposed between the two first semiconductor columns AA1 and AA2. The pair of first semiconductor columns AA1 and AA2 has the shapes of both end portions of a substantially oblate or a substantially ellipse divided by the conductive layer BW in a plan view seen from the Z direction.

Next, the conductive layer BW is etched back by using an etching technique to form a groove on the conductive layer BW. An insulating film (for example, a silicon oxide film) 25 is buried in the groove. Accordingly, the structures illustrated in FIGS. 16A to 16C are obtained.

Figure 17:
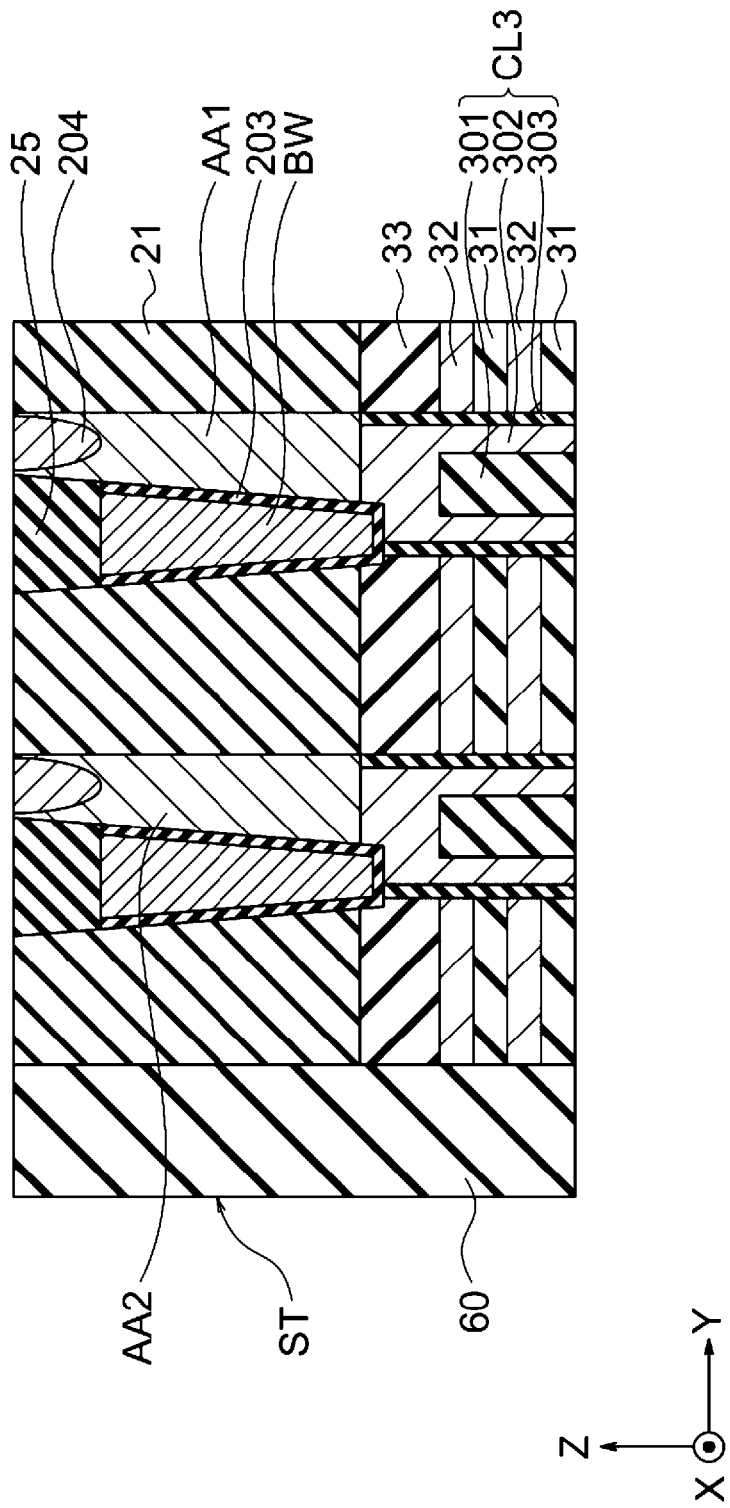
FIG. 17 is a schematic cross-sectional view illustrating the method for manufacturing the semiconductor storage device following FIG. 16A.

Next, as illustrated in FIG. 17, n-type impurities are introduced into the first semiconductor columns AA1 and AA2 by using a lithography technique and a doping technique, and an n-type impurity layer 204 is formed above the first semiconductor columns AA1 and AA2. Accordingly, the impurity layer 204 is electrically connected to the first semiconductor columns AA1 and AA2.

Next, as described with reference to FIGS. 11 and 12, a wiring structure (contacts CH and VY and bit lines BL) is formed. Accordingly, the semiconductor storage device 100b according to the second embodiment illustrated in FIGS. 13A to 13D are obtained.

According to the second embodiment, the conductive layer BW skewers the initial first semiconductor column AAi in the X direction, and the initial first semiconductor column AAi is divided. Although the conductive layer BW overlaps a portion of the central portion of the initial first semiconductor column AAi, the conductive layer BW does not overlap the first semiconductor columns AA1 and AA2 on both sides thereof. The first semiconductor columns AA1 and AA2 can function as channel portions of the two different drain-side select gates SGDO. The columnar body CL1 below the first semiconductor columns AA1 and AA2 can function as a memory string. Accordingly, the conductive layer BW does not increase the number of dummy memory cells and enables the cell region in the block BLOCK to be effectively used. As a result, according to the second embodiment, it is possible to obtain the same effect as the first embodiment.

Third Embodiment

Figure 18:
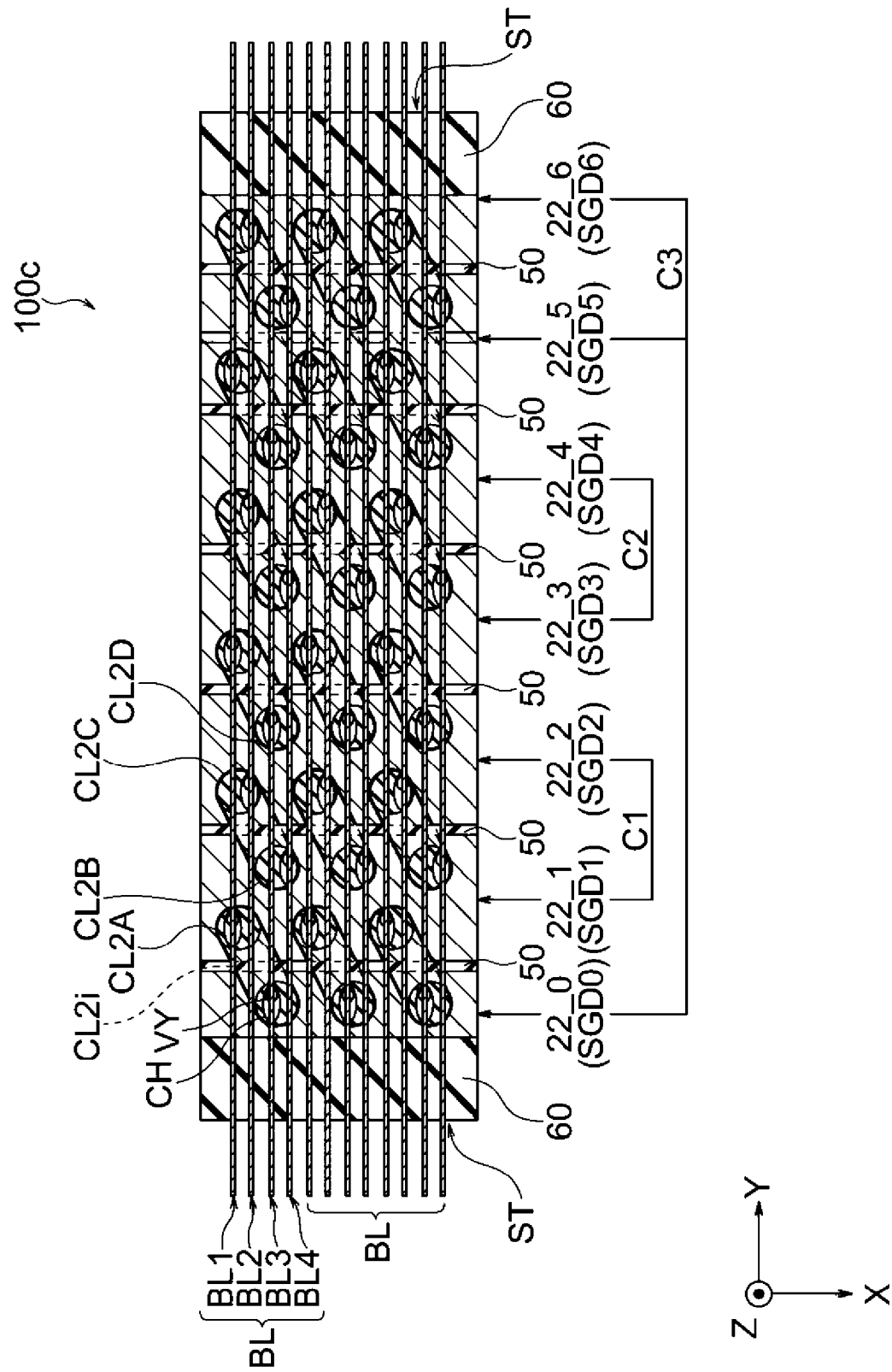
FIG. 18 is a schematic plan view illustrating a configuration example of a semiconductor storage device according to a third embodiment.

FIG. 18 is a schematic plan view illustrating a configuration example of a semiconductor storage device 100c according to the third embodiment.

In the third embodiment, a plurality of the conductive films 22 in the same block BLOCK and adjacent to each other in the Y direction are electrically connected. Other configurations of the third embodiment may be the same as the configurations of the first embodiment.

In some cases, in order to read out a plurality of data from the same block BLOCK simultaneously, the plurality of second conductive films 22 of the semiconductor storage device 100c arranged in the Y direction may be electrically connected to each other. For example, in FIG. 18, a second conductive film 22_1 of a drain-side select gate SGD1 and a second conductive film 22_2 of a drain-side select gate SGD2 adjacent to the drain-side select gate SGD1 are connected by a connection line C1. A second conductive film 22_3 of a drain-side select gate SGD3 and a second conductive film 22_4 of a drain-side select gate SGD4 adjacent to the drain-side select gate SGD3 are connected by a connection line C2. A second conductive film 22_5 of a drain-side select gate SGD5, a second conductive film 22_6 of a drain-side select gate SGD6 adjacent to the drain-side select gate SGD5, and a second conductive film 22_0 of the drain-side select gate SGD0 on the opposite side of the second conductive film 22_6 are electrically connected by a connection line C3.

Although not illustrated, the connection lines C1 to C3 may be configured with a contact plug provided in the staircase portion 2s and connected to each of the second conductive films 22_0 to 22_6 and a wiring layer above the contact plug. Alternatively, the connection lines C1 to C3 may be implemented by omitting the first division insulating film 50 in the staircase portion 2s and bringing the plurality of second conductive films into direct contact with each other.

Therefore, by connecting the plurality of second conductive films 22 and driving the plurality of second conductive films 22 simultaneously, it is possible to readout a large amount of data at one time. On the other hand, when a plurality of data are simultaneously transmitted to the same bit line BL, data contamination occurs.

In contrast, in at least one embodiment, the four bit lines BL1 to BL4 are provided correspondingly to one active area Aa (a pair of the adjacent columnar bodies CL2). That is, the columnar body CL2 and the bit line BL are provided at a ratio of 1:2. A plurality of the active areas Aa arranged in the stretching direction (Y direction) of the bit line BL share the bit line BL. Therefore, for example, the active areas Aa arranged in the Y direction in the upper stage of FIG. 18 correspond to the four bit lines BL1 to BL4. The data from the four drain-side select transistors configured with columnar bodies CL2A to CL2D arranged in the upper stage can be read out without contamination via the bit lines BL1, BL4, BL2, and BL3, respectively. That is, the four columnar bodies CL2A to CL2D corresponding to the second conductive films 22_1 and 22_2 connected by the connection line C1 can simultaneously output data to the bit lines BL1, BL4, BL2, and BL3, respectively.

Similarly, the four columnar bodies CL2 in the upper stage corresponding to the second conductive films 22_3 and 22_4 can simultaneously output data to the bit lines BL1, BL4, BL2, and BL3, respectively. Similarly, the four columnar bodies CL2 in the upper stage corresponding to the second conductive films 22_5, 22_6, and 22_0 can simultaneously output data to the bit lines BL1, BL4, BL2, and BL3, respectively. The second conductive films 22_1 and 22_2, the second conductive films 22_3 and 22_4, and the second conductive films 22_5, 22_5, and 22_0 are driven at timings different from each other. Since the second conductive films 22_5 and 22_0 are conductive films at the end of the block BLOCK, the second conductive films 22_5 and 22_0 correspond to one columnar body CL2 in the upper stage, respectively.

Similarly, the active areas Aa arranged in the Y direction in the second and subsequent stages also correspond to four bit lines BL, respectively. Therefore, the data from the drain-side select transistors configured with the columnar bodies arranged in the second and subsequent stages can also be read out without contamination via different bit lines BL.

A ratio between the number of columnar bodies CL2 and the number of bit lines BL may be 1:n (n is an integer of 3 or more). Here, a ratio between the number of active areas Aa and the number of bit lines BL is 1:2×n. The number of the second conductive films 22 connected to each other (driven simultaneously) is also n, and thus, the number of data read simultaneously can be further increased.

In a plan view seen from the Z direction, the contact VY may be a substantially circular shape, but may be a substantially elliptical shape having a major axis in the X direction. Accordingly, since the contact VY spreads in the X direction, the bit line BL can be reliably connected by the contact VY even if the bit line BL is slightly deviated in the X direction due to the lithography. However, as long as the contact VY can connect between the contact CH and the bit line BL, the direction of the major axis of the contact VY is not particularly limited. The direction of the major axis of the contact CH is not particularly limited.

Other configurations and manufacturing methods of the third embodiment may be the same as those of the first embodiment. Accordingly, according to the third embodiment, it is also possible to obtain the effects of the first embodiment. The third embodiment may be applied to the second embodiment.

Fourth Embodiment

Figure 19A:
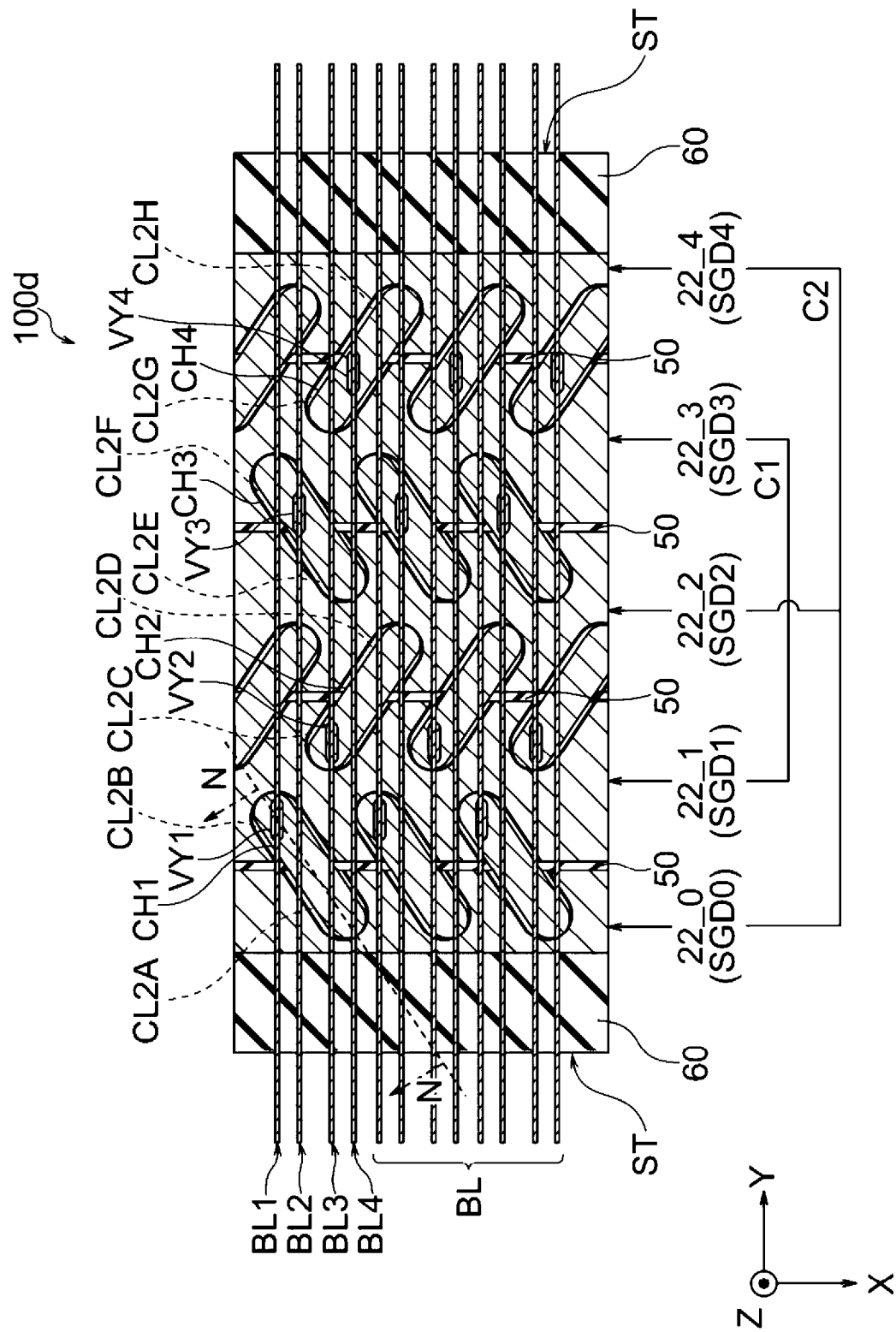
FIG. 19A is a schematic plan view illustrating a semiconductor storage device according to a fourth embodiment.
Figure 19B:
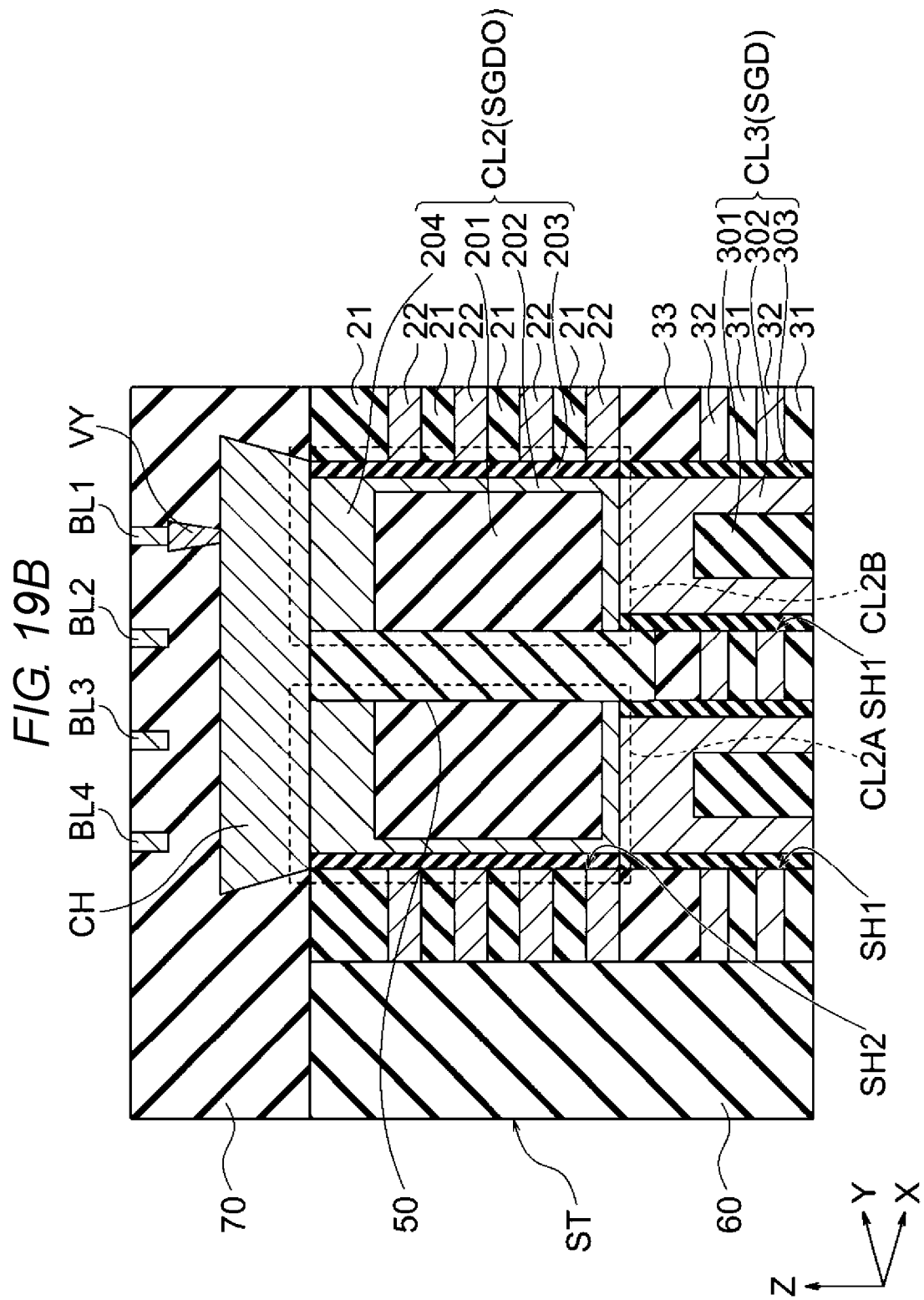
FIG. 19B is a schematic cross-sectional view taken along line N-N of FIG. 19A.

FIGS. 19A and 19B are a plan view and a cross-sectional view illustrating a configuration example of a semiconductor storage device 100d according to the fourth embodiment. FIG. 19B is a schematic cross-sectional view taken along line N-N of FIG. 19A.

In the fourth embodiment, as illustrated in FIG. 19B, the contact CH bridges above the pair of columnar bodies CL2a and CL2b. That is, the contact CH is provided above each of the impurity layers 204 of the columnar bodies CL2a and CL2b and connects each of the impurity layers 204. Accordingly, the semiconductor portions 202 of the columnar bodies CL2a and CL2b are electrically connected. In other words, the contact CH is commonly electrically connected to the semiconductor portions 202 of the columnar bodies CL2*a* and CL2*b* over the pair of columnar bodies CL2*a* and CL2*b* formed by dividing each active area Aa and the first division insulating film 50. The impurity layer 204 may be a diffusion layer formed by introducing the implant technology, but instead of the diffusion layer, a doped polysilicon formed by burying polysilicon doped with impurities may be used.

One contact VY is provided on each contact CH. Each contact CH is connected to one bit line BL via the contact VY.

According to the fourth embodiment, the contact CH is provided corresponding to two adjacent columnar bodies CL2 (one active area Aa). Accordingly, the number of contacts CH and VY can be reduced to about half the number of columnar bodies CL2. As the number of contacts CH decreases, the layout area of the contacts CH can be increased. As the number of contacts VY decreases, the density of contacts VY decreases. Accordingly, the lithography and etching processes in forming the contact VY are facilitated.

As illustrated in FIG. 19A, contacts CH are provided for each pair of the columnar bodies CL2 (active area Aa). For example, a pair of columnar bodies CL2A and CL2B is provided below a contact CH1. A pair of columnar bodies CL2C and CL2D is provided below a contact CH2. A pair of columnar bodies CL2E and CL2F is provided below a contact CH3. A pair of columnar bodies CL2G and CL2H is provided below a contact CH4. In FIG. 19A, the columnar bodies CL2A to CL2H are below the contacts CH1 to CH4, and outer shapes thereof do not appear. Contacts VY1 to VY4 are provided on the contacts CH1 to CH4, and the contacts CH1 to CH4 are connected to the bit lines BL1, BL3, BL2, and BL4, respectively.

Also in the fourth embodiment, the four bit lines BL1 to BL4 are provided with respect to one active area Aa (a pair of the adjacent columnar bodies CL2). That is, the columnar body CL2 and the bit line BL are provided at a ratio of 1:2. On the other hand, the two active areas Aa adjacent in the stretching direction (Y direction) of the bit line BL are deviated by a half pitch in the X direction and share the two bit lines BL. Therefore, for example, the pair of columnar bodies CL2A and CL2B in FIG. 19A correspond to the four bit lines BL1 to BL4. The pair of columnar bodies CL2C and CL2D adjacent to the pair of columnar bodies CL2A and CL2B share only the bit lines BL3 and BL4 among the bit lines BL1 to BL4 together with the pair of columnar bodies CL2A and CL2B. Since the pair of columnar bodies CL2E and CL2F adjacent to the pair of columnar bodies CL2C and CL2D deviate by one pitch in the X direction with respect to the pair of columnar bodies CL2A and CL2B, the pair of columnar bodies CL2E and CL2F share the bit lines BL1 to BL4 together with the pair of columnar bodies CL2A and CL2B. As described above, in the fourth embodiment, the active areas Aa adjacent to each other in the Y direction share two bit lines. The active areas Aa intermittently adjacent in the Y direction share four bit lines BL.

The contacts VY1 to VY4 are provided on the contacts CH1 to CH4, respectively, and the contacts CH1 to CH4 are connected to the bit lines BL1, BL3, BL2, and BL4, respectively.

In the fourth embodiment, the second conductive film 22_1 of the drain-side select gate SGD1 and the second conductive film 22_3 of the drain-side select gate SGD3 are connected by the connection line C1. The second conductive film 22_0 of the drain-side select gate SGD0, the second conductive film 22_2 of the drain-side select gate SGD2, and the second conductive film 22_4 of the drain-side select gate SGD4 are electrically connected by the connection line C2.

When the second conductive films 22_1 and 22_3 are driven, the four columnar bodies CL2B, CL2C, CL2F, and CL2G corresponding to the second conductive films can simultaneously output data to the bit lines BL1, BL3, BL2, and BL4, respectively. When the second conductive films 22_0, 22_2, and 22_4 are driven, the four columnar bodies CL2A, CL2D, CL2E, and CL2H corresponding to the second conductive films 22_0, 22_2, and 22_4 can simultaneously output data to the bit lines BL1, BL3, BL2, and BL4, respectively. Therefore, the data from the four drain-side select transistors can be read out without contamination via the bit lines BL1, BL4, BL2, and BL3, respectively.

As illustrated in FIG. 19B, the pair of columnar bodies CL2A and CL2B share the contact CH, but the two drain-side select gates SGDO corresponding to the columnar bodies CL2A and CL2B allow different second conductive films 22 to operates as gate electrodes. Therefore, data contamination between the two drain-side select gates SGDO corresponding to the columnar bodies CL2A and CL2B is also prevented.

The ratio between the number of columnar bodies CL2 and the number of bit lines BL may be 1:n (n is an integer of 3 or more). Here, the ratio between the number of contacts CH and the number of bit lines BL is 1:2×n. Thereby, similarly to the third embodiment, it is possible to increase the number of data that are read simultaneously.

In the fourth embodiment, the layout of the contacts CH and VY is different from that of the first embodiment, and the contact CH is provided corresponding to the active area Aa. Accordingly, the layout area of the contact CH can be increased, and the density of the contact VY can be reduced. Accordingly, the lithography and etching processes in forming the contact VY are facilitated.

Other configurations and manufacturing methods of the fourth embodiment may be the same as those of the first embodiment. According to the fourth embodiment, it is also possible to obtain the effects of the first embodiment. The fourth embodiment may be applied to the second embodiment.

Figure 20:
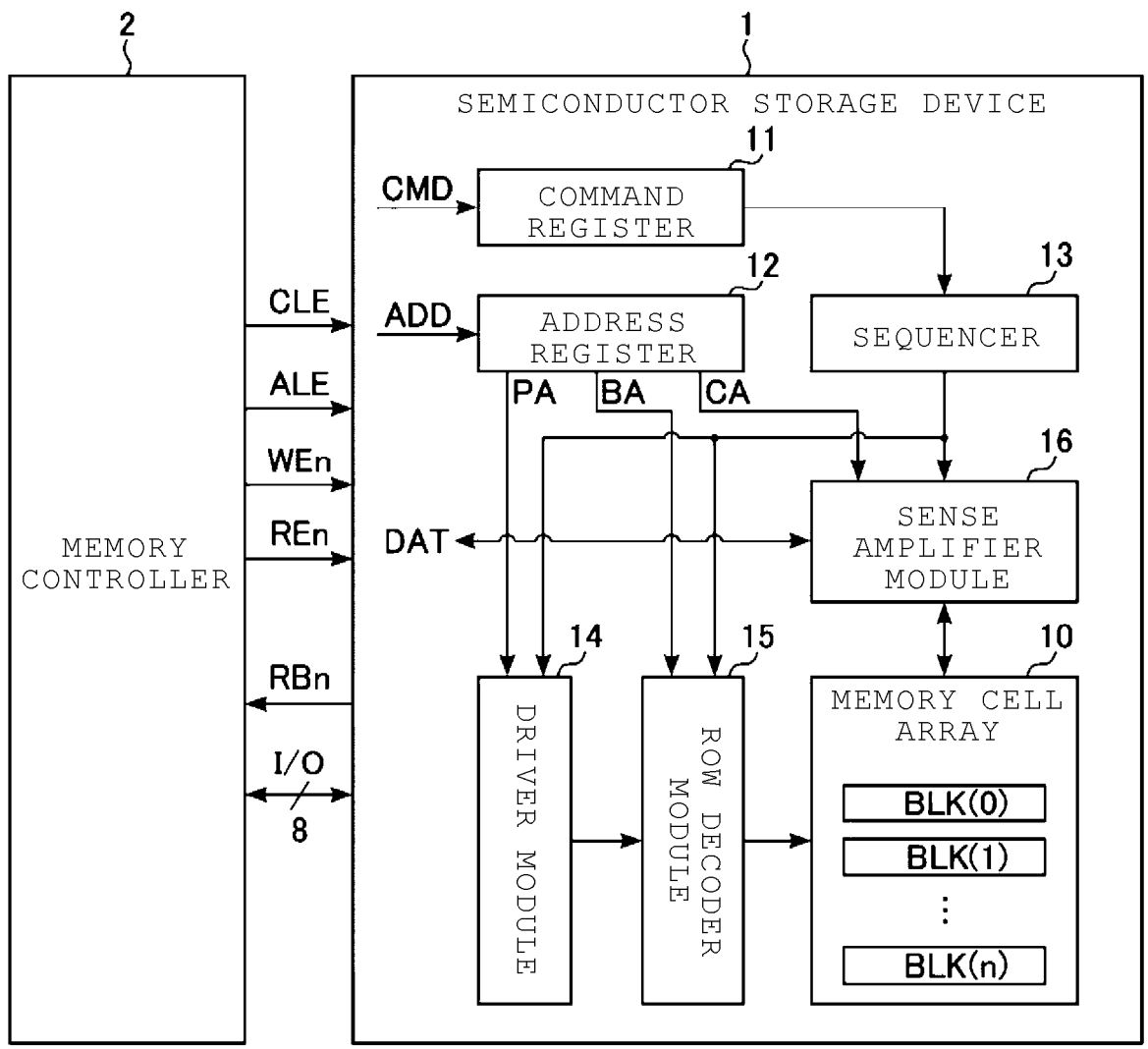
FIG. 20 is a block diagram illustrating a configuration example of a semiconductor storage device to which any of the above-mentioned embodiments is applied.

FIG. 20 is a block diagram illustrating a configuration example of a semiconductor storage device to which any of the above embodiments is applied. A semiconductor storage device 100 is a NAND flash memory capable of non-volatilely storing data and is controlled by an external memory controller 1002. Communication between the semiconductor storage device 100 and the memory controller 1002 supports, for example, the NAND interface standard.

As illustrated in FIG. 20, the semiconductor storage device 100 includes, for example, a memory cell array MCA, a command register 1011, an address register 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). The block BLK is a set of the plurality of memory cells capable of non-volatilely storing data and is used, for example, as an erase unit of data. The plurality of bit lines and the plurality of word lines are provided in the memory cell array MCA. Each memory cell is associated with, for example, one bit line and one word line. The detailed configuration of the memory cell array MCA will be described later.

The command register 1011 stores a command CMD received by the semiconductor storage device 100 from the memory controller 1002. The command CMD includes, for example, an instruction for causing the sequencer 1013 to execute a read operation, a write operation, an erase operation, and the like.

The address register 1012 stores address information ADD received by the semiconductor storage device 100 from the memory controller 1002. The address information ADD includes, for example, a block address BAdd, a page address PAdd, and a column address CAdd. For example, a block address BA, a page address CAD, and a column address CAdd are used to select the block BLK, the word line, and the bit line, respectively.

The sequencer 1013 controls the overall operations of the semiconductor storage device 100. For example, the sequencer 1013 controls the driver module 1014, the row decoder module 1015, the sense amplifier module 1016, and the like based on the command CMD stored in the command register 1011 to execute a read operation, a write operation, an erase operation, and the like.

The driver module 1014 generates voltages used in the read operation, the write operation, the erase operation, and the like. Then, the driver module 1014 applies a generated voltage to the signal line corresponding to the selected word line based on, for example, the page address PAdd stored in the address register 1012.

The row decoder module 1015 includes a plurality of row decoders RD. The row decoder RD selects one block BLK in the corresponding memory cell array MCA based on the block address BAdd stored in the address register 1012. Then, the row decoder RD transfers, for example, the voltage applied to the signal line corresponding to the selected word line to the selected word line in the selected block BLK.

In the write operation, the sense amplifier module 1016 applies a desired voltage to each bit line according to write data DAT received from a memory controller 200. In the read operation, the sense amplifier module 1016 determines the data stored in the memory cell based on the voltage of the bit line and transfers the determination result to the memory controller 200 as read data DAT.

The semiconductor storage device 100 and the memory controller 200 described above may configure one semiconductor device by combining the semiconductor storage device 100 and the memory controller 200. As such a semiconductor device, exemplified are a memory card such as an SDTM card, a solid state drive (SSD), and the like.

Figure 21:
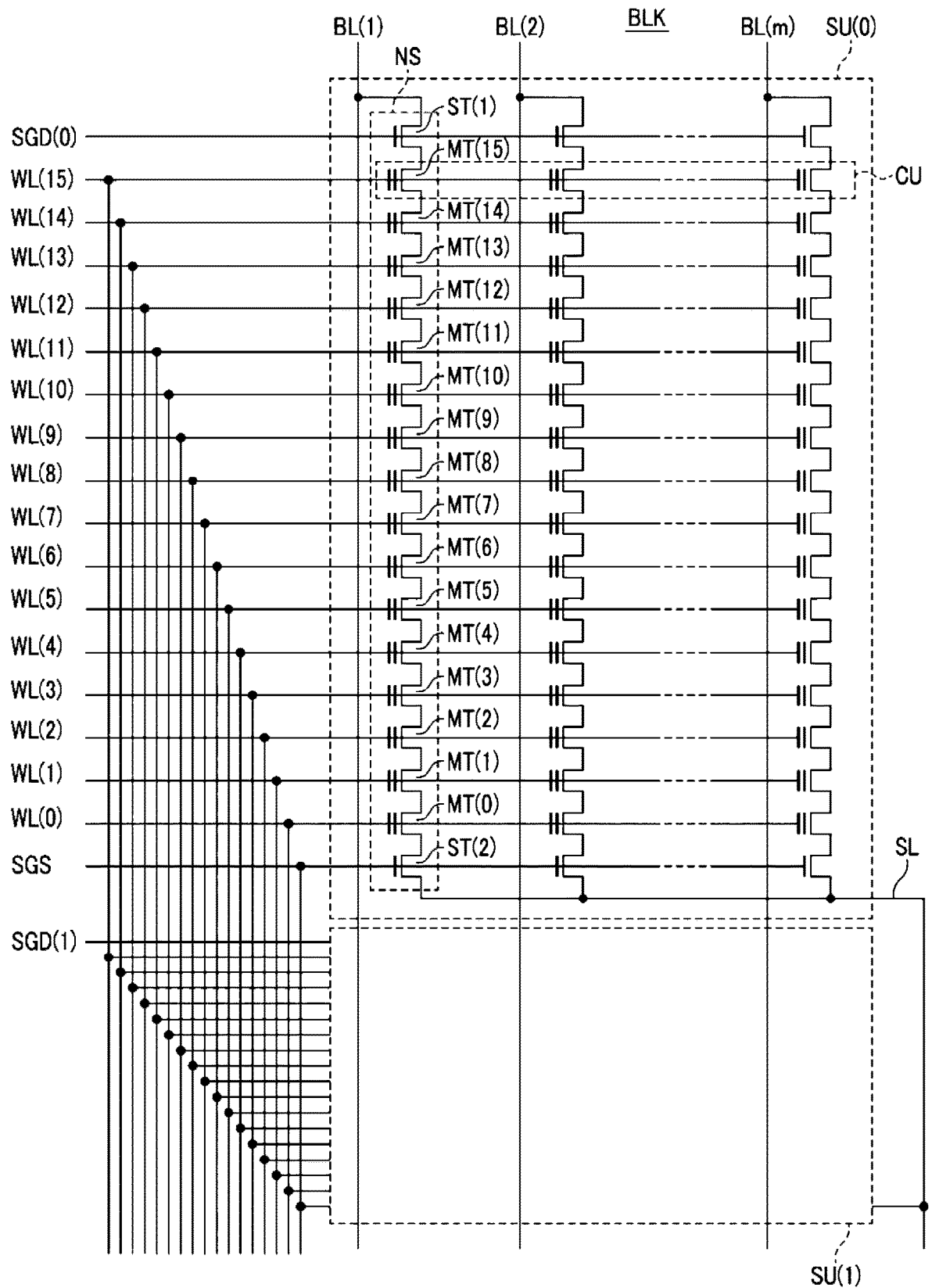
FIG. 21 is a circuit diagram illustrating an example of a circuit configuration of a memory cell array.

FIG. 21 is a circuit diagram illustrating an example of the circuit configuration of the memory cell array MCA. One block BLK out of the plurality of blocks BLK in the memory cell array MCA is extracted. As illustrated in FIG. 21, the block BLK includes a plurality of string units SU(0) to SU(k) (k is an integer of 1 or more).

Each string unit SU includes a plurality of NAND strings NS associated with bit lines BL(0) to BL(m) (m is an integer of 1 or more). Each NAND string NS includes, for example, memory cell transistors MT(0) to MT(15), and select transistors ST(1) and ST(2). A memory cell transistor MT includes a control gate and a charge storage layer and stores data in a non-volatile manner. Each of the select transistors ST(1) and ST(2) is used to select the string unit SU during various operations.

In each of the NAND strings NS, the memory cell transistors MT(0) to MT(15) are connected in series. The drain of the select transistor ST(1) is connected to the associated bit line BL, and the source of the select transistor ST(1) is connected to one end of the memory cell transistors MT(0) to MT(15) connected in series. The drain of the select transistor ST(2) is connected to the other end of the memory cell transistors MT(0) to MT(15) connected in series. The source of the select transistor ST(2) is connected to a source line SL.

In the same block BLK, the control gates of the memory cell transistors MT(0) to MT(15) are commonly connected to word lines WL(0) to WL(7), respectively. The gates of the respective select transistors ST(1) in the string units SU(0) to SU(k) are commonly connected to select gate lines SGD(0) to SGD(k), respectively. The gate of the select transistor ST(2) is commonly connected to select gate lines SGS.

In the circuit configuration of the memory cell array 10 described above, the bit line BL is shared by the NAND strings NS to which the same column address is assigned in each string unit SU. The source line SL is shared among, for example, the plurality of blocks BLK.

A set of the plurality of memory cell transistors MT connected to the common word line WL in one string unit SU is referred to as, for example, a cell unit CU. For example, the storage capacity of the cell unit CU including the memory cell transistor MT, each of which stores 1-bit data, is defined as "1 page data". The cell unit CU may have a storage capacity of two-page data or more depending on the number of bits of data stored in the memory cell transistor MT.

The memory cell array MCA in the semiconductor storage device 100 according to at least one embodiment is not limited to the circuit configuration described above. For example, the number of memory cell transistors MT and the select transistors ST(1) and ST(2) in each NAND string NS may be any number. The number of string units SU in each block BLK may be any number.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor storage device, the method comprising:
    forming a first stacked body by alternately stacking a first insulating film and a first sacrificial film in a first direction;
    forming a first columnar body including: (i) a first semiconductor portion extending in the first stacked body in the first direction, and (ii) a charge trapping film disposed on an outer peripheral surface of the first semiconductor portion;
    forming a second columnar body including: (i) a second semiconductor portion of the second columnar body disposed in a second direction intersecting the first direction and extending in the first stacked body in the first direction, and (ii) a charge trapping film disposed on an outer peripheral surface of the second semiconductor portion;
    forming a second insulating film above the first stacked body;
    forming a third columnar body including: (i) a third semiconductor portion provided on both the first columnar body and the second columnar body and extending in the second insulating film in the first direction, and (ii) a first gate insulating film disposed on an outer peripheral surface of the third semiconductor portion; and forming a first division insulating film extending in the first direction and a third direction, the third direction intersecting the first direction and the second direction, and the first division insulating film dividing the third semiconductor portion of the third columnar body in the second direction.

2. The method according to claim 1, further comprising:
after the formation of the second columnar body,
forming a second stacked body by alternately stacking the second insulating film and a second sacrificial film in the first direction;
forming a slit penetrating the first stacked body and the second stacked body; and
forming a first conductive film between the first insulating films by removing the first and second sacrificial films via the slit and forming a second conductive film above the first stacked body, wherein
the first division insulating film divides both the third semiconductor portion of the third columnar body and the second conductive film in the second direction.

3. The method according to claim 2, further comprising:
after the formation of the second columnar body,
forming a third stacked body by alternately stacking the third insulating film and a third sacrificial film on the first stacked body in the first direction; and
forming a fourth columnar body including a fourth semiconductor portion, extending in the third stacked body in the first direction, and a second gate insulating film disposed on an outer peripheral surface of the fourth semiconductor portion, wherein
the slit penetrates the first to third stacked bodies,
first and second spaces are formed by removing the first to third sacrificial films via the slit, and a third space is formed between the third insulating films, and
the first and second conductive films are formed by burying a conductive material in the first to third spaces, and a third conductive film is formed between the third insulating films.

4. The method according to claim 3, wherein a division insulating film electrically dividing into the first and second conductive films is formed in the slit.

5. The method according to claim 1, wherein the first gate insulating film is a silicon oxide film.

6. The method according to claim 1, wherein the first gate insulating film is a stacked film including a silicon oxide film, a silicon nitride film, and a silicon oxide film.

7. The method according to claim 1, further comprising:
forming a slit penetrating the first stacked body;
forming a first conductive film between the first insulating films by removing the first sacrificial film via the slit;
forming a first division insulating film extending in the first direction and the third direction, the third direction intersecting the first direction and the second direction, and the first division insulating film dividing both the third semiconductor portion of the third columnar body and the second insulating film in the second direction; and
forming a second conductive film inside the first division insulating film.

8. The method according to claim 7, further comprising:
after the formation of the second columnar body,
forming a second stacked body by alternately stacking a third insulating film and a third sacrificial film in the first direction on the first stacked body; and
forming a fourth columnar body including a fourth semiconductor portion extending in the second stacked body in the first direction, and including a second gate insulating film disposed on an outer peripheral surface of the fourth semiconductor portion, wherein
the slit penetrates the first and second stacked bodies,
a first space is formed by removing the first and second sacrificial films via the slit, and a second space is formed between the third insulating films, and
the first conductive film is formed by burying a conductive material in the first and second spaces, and a second conductive film is formed between the third insulating films.

9. The method according to claim 8, wherein the second gate insulating film is a silicon oxide film.

10. The method according to claim 7, wherein a division insulating film electrically dividing into the first and second conductive films is formed in the slit.

11. The method according to claim 7, wherein a second gate insulating film is formed by stacking a silicon oxide film, a silicon nitride film, and a silicon oxide film.

12. The method according to claim 1, further comprising:
forming a first contact, the first contact commonly connected on the third semiconductor portion of each of the two third columnar bodies, above the first and second columnar bodies;
forming a second contact on the first contact; and
forming wiring on the second contact.

* * * * *